(12) United States Patent
MacDougall et al.

(10) Patent No.: US 8,576,074 B2
(45) Date of Patent: Nov. 5, 2013

(54) CHARGED CAPACITOR WARNING SYSTEM AND METHOD

(75) Inventors: Frederick W. MacDougall, San Diego, CA (US); Mark Allen Schneider, El Cajon, CA (US); Ross MacDonald, San Diego, CA (US)

(73) Assignee: General Atomics, San Diego, CA (US)

( * ) Notice: Subject to any disclaimer, the term of this patent is extended or adjusted under 35 U.S.C. 154(b) by 611 days.

(21) Appl. No.: 12/821,072

(22) Filed: Jun. 22, 2010

(65) Prior Publication Data

US 2011/0012740 A1  Jan. 20, 2011

Related U.S. Application Data

(60) Provisional application No. 61/219,357, filed on Jun. 22, 2009, provisional application No. 61/255,446, filed on Oct. 27, 2009, provisional application No. 61/223,680, filed on Jul. 7, 2009.

(51) Int. Cl.
  *G08B 13/26* (2006.01)
(52) U.S. Cl.
  USPC .............. 340/562; 340/664; 340/636.17
(58) Field of Classification Search
  USPC .............. 340/653, 636.17, 657, 664, 562; 320/107, 112, 127, 135
  See application file for complete search history.

(56) References Cited

U.S. PATENT DOCUMENTS

| | | | |
|---|---|---|---|
| 3,623,048 A * | 11/1971 | Haddock | ............... 340/503 |
| 4,423,457 A | 12/1983 | Brajder | |
| 4,983,954 A | 1/1991 | Huston | |
| 5,119,009 A | 6/1992 | McCaleb et al. | |
| 5,155,428 A | 10/1992 | Kang | |
| 6,211,684 B1 * | 4/2001 | McKee et al. | ............... 324/548 |
| 6,236,553 B1 * | 5/2001 | Widell | ............... 361/189 |
| 7,508,171 B2 * | 3/2009 | Carrier et al. | ............... 320/138 |
| 2005/0077878 A1 | 4/2005 | Carrier et al. | |
| 2007/0273333 A1 | 11/2007 | Andruk et al. | |
| 2008/0074064 A1 | 3/2008 | Thomsen | |
| 2010/0320970 A1 | 12/2010 | Paczkowski | |

FOREIGN PATENT DOCUMENTS

| | | |
|---|---|---|
| JP | 2005188311 | 7/2005 |
| KR | 1019990069615 | 9/1999 |
| KR | 1020070113121 | 11/2007 |
| WO | 2011005534 A2 | 1/2011 |
| WO | 2012021219 A1 | 2/2012 |

OTHER PUBLICATIONS

PCT; International Search Report and Written Opinion of the International Searching Authority; Corresponding to International Application No. PCT/US2011/041932; Mailed Sep. 27, 2011; 9 Pages.

(Continued)

*Primary Examiner* — Hung T. Nguyen
(74) *Attorney, Agent, or Firm* — Fitch, Even, Tabin & Flannery LLP

(57) ABSTRACT

A capacitor warning circuit, and method of providing a warning are provided, the circuit comprising a capacitor capable of being charged to a charged state and a warning circuit coupled to the capacitor and adapted to provide an indication that the capacitor is in the charged state, wherein the warning circuit is powered by energy accumulated in the capacitor when the capacitor is in the charged state.

25 Claims, 19 Drawing Sheets

(56) References Cited

OTHER PUBLICATIONS

WIPO; International Search Report and Written Opinion of the International Searching Authority for PCT Application No. PCT/US2010/039523, mailed Feb. 9, 2011; 10 pages.

MacDougall et al., "Capacitor with an Internal Dump Resistance", related U.S. Appl. No. 12/831,955, filed Jul. 7, 2010.

MacDougall et al., "Charged Capacitor Warning System and Method", related International Application No. PCT/US10/39523 filed Jun. 22, 2010.

USPTO; Non-Final Office Action issued in U.S. Appl. No. 12/831,955; Mailed Jul. 3, 2012; 6 Pages.

PCT; International Preliminary Report on Patentability; Mailed Jan. 10, 2013; 6 Pages, PCT/US2011/041932.

* cited by examiner

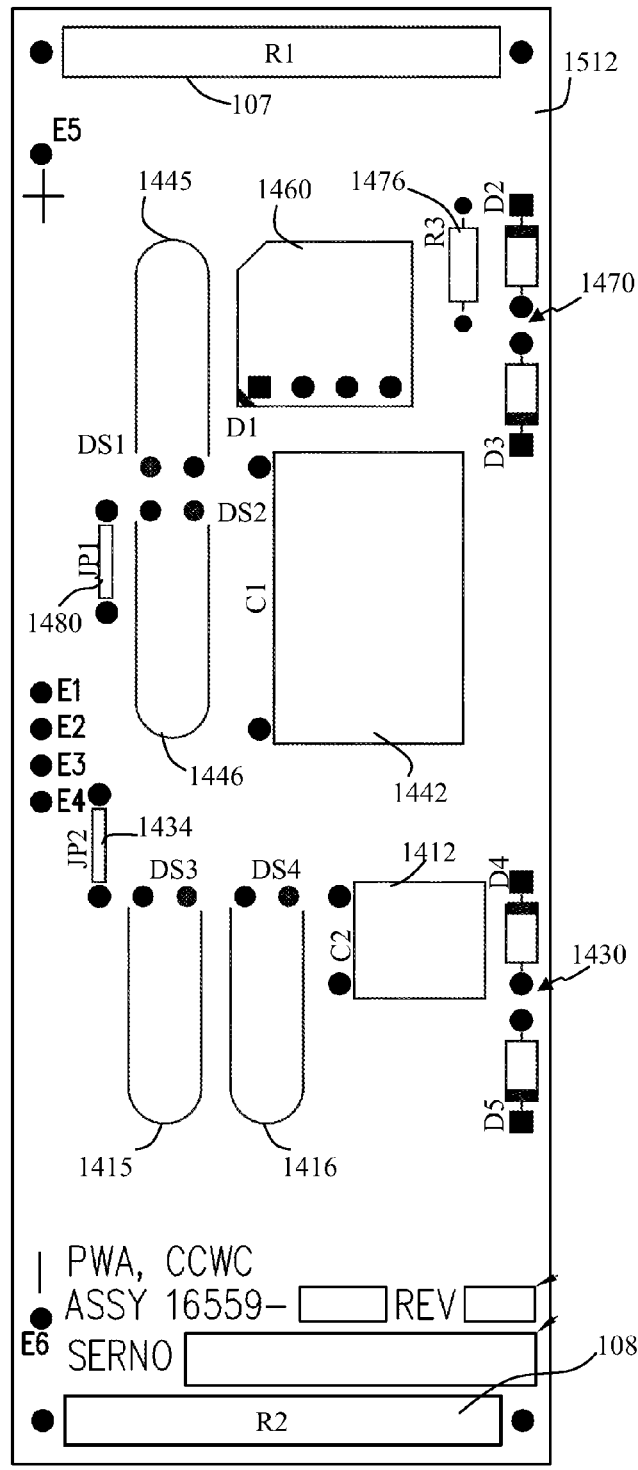 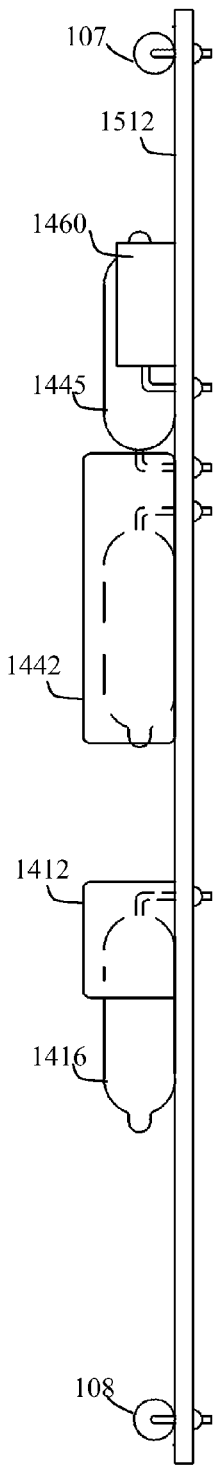
*Figure 16*      *Figure 17*

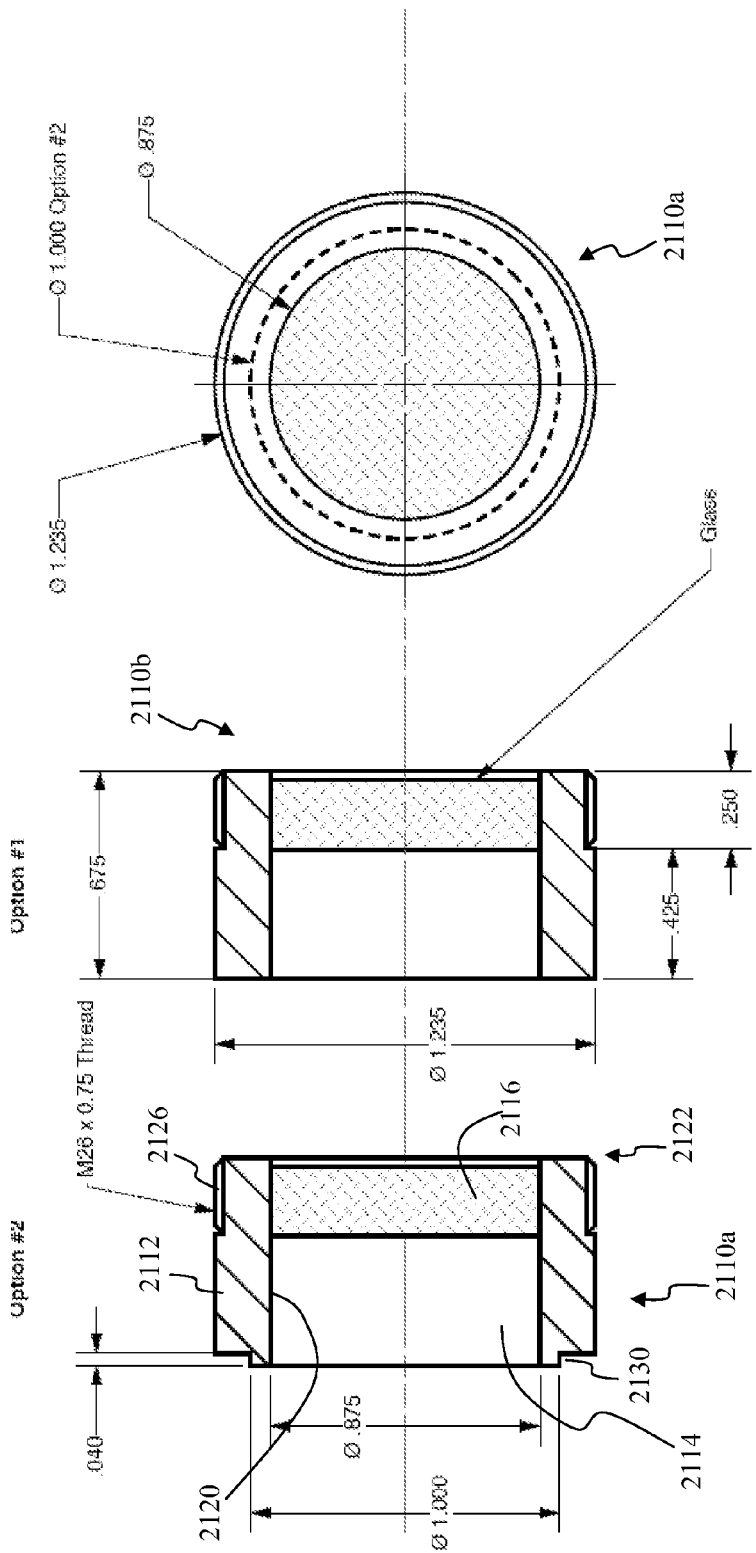

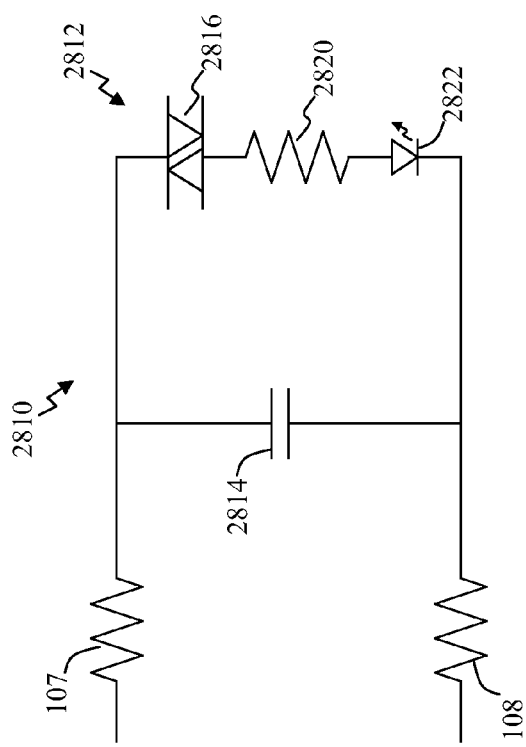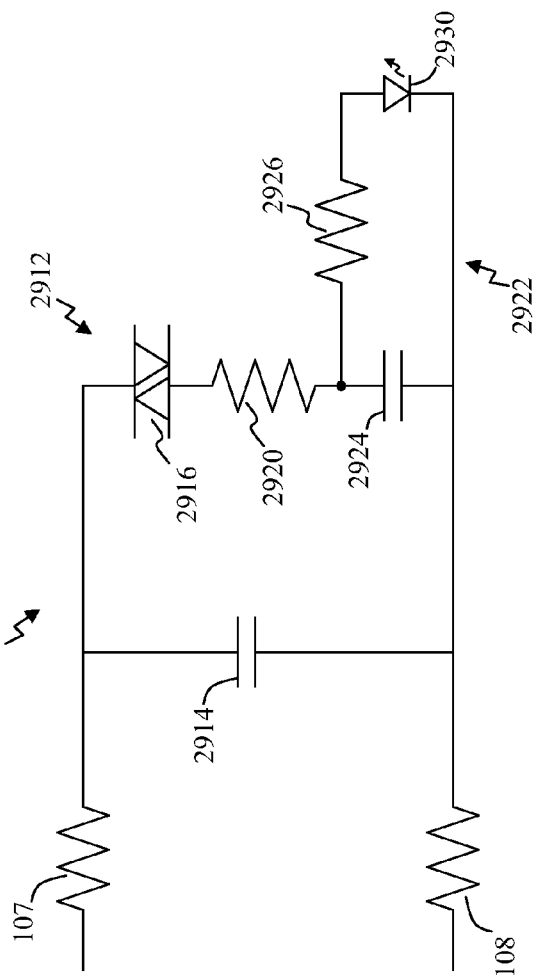

CHARGED CAPACITOR WARNING SYSTEM AND METHOD

This application claims the benefit of U.S. Provisional Application No. 61/219,357, filed Jun. 22, 2009, entitled CHARGED CAPACITOR WARNING SYSTEM AND METHOD, for MacDougall et al., which is incorporated in its entirety herein by reference; the benefit of U.S. Provisional Application No. 61/255,446, filed Oct. 27, 2009, entitled CHARGED CAPACITOR WARNING SYSTEM AND METHOD, for MacDougall et al., which is incorporated in its entirety herein by reference; and the benefit of U.S. Provisional Application No. 61/223,680, filed Jul. 7, 2009, entitled CAPACITOR WITH AN INTERNAL DUMP RESISTANCE, for Frederick W. MacDougall, which is incorporated in its entirety herein by reference.

BACKGROUND

The present embodiments relate generally to capacitors, and more specifically to capacitor systems.

Capacitors have a wide range of uses. Further, high voltage high energy capacitors can be employed in a large number of applications. For example, some high voltage high energy capacitors are used to rapidly discharge and to deliver power to a corresponding system.

SUMMARY OF THE INVENTION

Several embodiments of the invention advantageously address the needs above as well as other needs by providing a capacitor warning circuit that comprise a capacitor configured to be charged to at least a first charged state; and a warning circuit coupled to the capacitor and adapted to provide an indication that the capacitor is in the first charged state, wherein the warning circuit is powered by energy accumulated in the capacitor when the capacitor is charged to the first charged state.

Other embodiments provide methods of providing a warning for a capacitor, where the methods comprise charging a voltage of a capacitor; powering a warning circuit coupled to the capacitor with energy accumulated in the capacitor when the capacitor is in a charged state; and providing, by the warning circuit, an indication when the capacitor voltage has reached a charged state.

BRIEF DESCRIPTION OF THE DRAWINGS

The features and advantages of embodiments of the present invention will be more apparent from the following more particular description thereof, presented in conjunction with the following drawings wherein:

FIG. 16 shows an overhead view of an embodiment of a circuit board layout of a relaxation oscillator circuit board.

FIG. 17 shows a simplified side view of an embodiment of a relaxation oscillator circuit board.

FIG. 21 depicts a simplified cross-sectional view of a sight glass lens structure according to some embodiments.

FIG. 22 depicts a simplified cross-sectional view of a sight glass lens structure according to some alternative embodiments.

FIG. 23 depicts a plane front view of the sight glass lens structure of FIG. 21.

FIG. 28 depicts a simplified circuit diagram of a warning system that can be cooperated with a high voltage high energy capacitor according to some embodiments.

FIG. 29 depicts a simplified circuit diagram of a warning system that can be cooperated with a high voltage high energy capacitor according to some embodiments.

Figure 1:
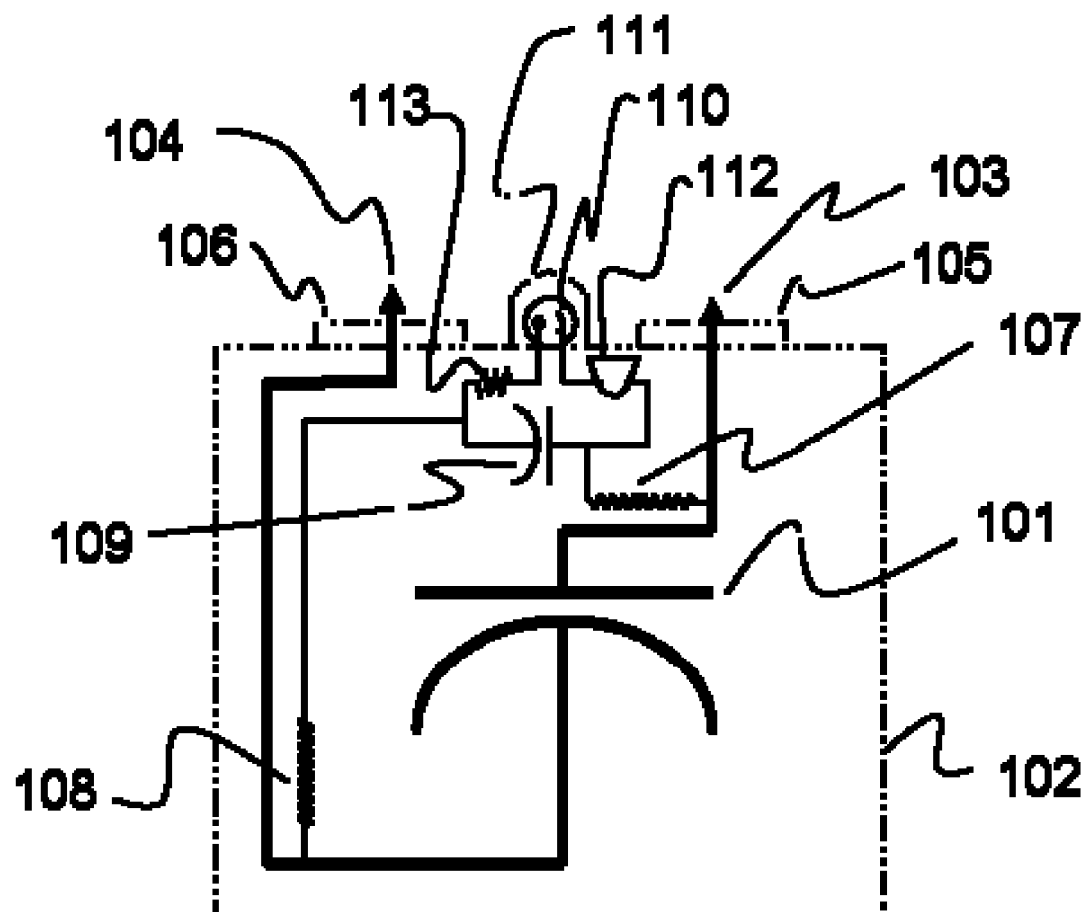
FIG. 1 is a schematic of one embodiment of a charged capacitor warning circuit for a capacitor with two terminals, both of which are insulated from the capacitor case.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

The following description is not to be taken in a limiting sense, but is made merely for the purpose of describing the general principles of the invention. The scope of the invention should be determined with reference to the claims.

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Referring to the embodiment of FIG. 1, a capacitor system is depicted with a high voltage high energy capacitor 101 encased in a housing or case 102, which can be constructed of plastic, metal and/or other relevant material, with two terminals 103 and 104 fed through insulating bushings 105 and 106 respectively. Typical values for the capacitor 101 might be 10,000 VDC, 1000 µF, storing 50,000 Joules of energy. By comparison, a typical defibrillator capacitor would be rated 2,000 VDC, 100 µF, and store 5-200 Joules. Both the defibrillator capacitor and the capacitor 101 as described above pose a significant safety concern when the capacitors are charged with the large capacitor 101 being of greater concern.

Also in FIG. 1, there are two high voltage resistors 107 and 108 coupled to either side of the energy storage capacitor 101. In one embodiment, the resistors 107 and 108 each have a rating of 50,000,000 ohms. The resistance values of the resistors 107 and 108 result in a small maximum current that can flow through the resistors and be available to a warning circuit made up of capacitor 109, lamp 110 with lens 111, buzzer 112 and ballast resistor 113. The warning circuit may also be referred to as a low current circuit, a low voltage circuit or a signal circuit. In one exemplary embodiment, based on the values given above for resistors 107 and 108 and the maximum voltage of capacitor 101, the maximum current available to the warning circuit is 0.002 amps. It is understood that the maximum current available to the warning circuit will be a function of several variables, including the maximum voltage of the capacitor 101 and the values of resistors 107 and 108 such that in other embodiments, the maximum current available to the warning circuit will vary. In any event, in some embodiments, the maximum current available to the warning circuit is intended to be an amount that will greatly reduce the possibility of harm coming to persons coming into contact with any part of the warning circuit.

In the illustrated embodiment, the warning circuit includes a relaxation oscillator circuit made up of a low voltage, low energy capacitor 109 and a neon lamp 110 with the lens 111. In one embodiment, the capacitor 109 operation is at 110 volt, 20 microfarad capacitor that can operate at less than 10 Joules (e.g., about 1 Joule). As capacitor 101 is charging, due to the low current flowing into the warning system via resistors 107 and 108, an electrical charge accumulates on the capacitor 109 and the voltage on the capacitor 109 and neon lamp 110 increases. Eventually, the lamp 110 will reach the point where it will conduct. At that point, current flows around the warning circuit as capacitor 109 discharges causing the lamp 110 to flash once and the buzzer 112 to emit a sound. The maximum current flowing through the warning circuit will be limited by the impedance of the components including the ballast resistor 113 that is in the circuit primarily to limit the peak current associated with the discharge of the capacitor 109. As the capacitor 109 discharges, the capacitor voltage and voltage on lamp 110 decrease. When the voltage on lamp 110 is low enough, the lamp will extinguish resulting in an open circuit. At that point, the current through resistors 107 and 108 will start charging capacitor 109 again allowing the cycle to repeat. This will provide a repeating or periodic illumination of the lamp 110 and repeating sound emission from the buzzer 112. The repetition rate of the circuit is affected by the RC time constant between the high voltage resistors 107, 108 and the capacitor 109 as well as the voltage on the capacitor 101. It is noted in one embodiment, that the intensity of the light illuminating from the lamp 110 and the sound emanating from the buzzer 112 does not change as the voltage on capacitor 101 increases. However, in this embodiment, the repetition rate of the flashing of the lamp 110 and the sound emanation of the buzzer 112 will increase as the voltage of the capacitor 101 increases to its fully charged state.

In the example provided above, if the capacitor 101 has no outside charging source, the capacitor 101 will slowly discharge. The RC time constant for the values give for the capacitor 101 and the high voltage resistors 107 and 108 for this self discharge is approximately 1.2 days with 5 time constants being approximately 5 days. About that time, the voltage on capacitor 101 will fall below the ignition voltage on lamp 110 and the circuit as shown in FIG. 1 will cease conducting current.

In accordance with several embodiments, the warning circuit is powered by energy accumulated in the capacitor 101 when the capacitor 101 is in the charged state. Thus, a separate energy source is not needed to operate the warning circuit and the warning circuit is integrated with the capacitor 101. The voltage threshold or accumulated energy level of the capacitor 101 defining the charged state when the warning circuit is powered and activated depends on the application as is discussed further below.

In accordance with several embodiments, the warning circuit functions to provide an indication to a user or operator that the capacitor 101 is in a charged state that is sufficient to result in risk of electrical shock causing great harm or death to a human operator if the operator inadvertently comes into contact with the terminals 103 and 104 or intentionally comes into contact with the terminals believing that the capacitor is in a non-charged state. The charged state includes but is not limited to the fully charged state. That is, in some embodiments, the charged state includes the charge level of the capacitor above which the capacitor is unsafe for human contact. In one embodiment, the values of the components of the warning system are selected so that the warning circuit will provide an indication to the user that the capacitor is charged at least to a voltage level and energy storage level that will result in danger to an operator if contact is made with the terminals 103 and 104. Accordingly, the capacitor 101 may be in a non-charged state in which case, it is safe for an operator to come into contact with the terminals 103, 104. However, as the capacitor charges up to a charged state that is beyond a voltage where it is safe for an operator to come into contact with the terminals 103, 104, the components of the warning circuit are selected to cause the lamp 110 to flash and/or the buzzer 112 to sound alerting the operator that the capacitor 101 is charged beyond a level that is safe. For example, once the voltage of the capacitor exceeds a given voltage threshold, the warning circuit conducts causing repeating flashing and warning sounds, this will occur until the capacitor is fully charged and as long as the charge on the capacitor has not yet depleted back below the warning threshold. Once the capacitor 101 voltage is below the voltage threshold, the warning circuit will no longer flash and sound. Thus, in some embodiments, the capacitor 101 comprises at least a 50 VDC capacitor that can store at least 5 Joules of energy, and in other embodiments, the capacitor comprises at least a 10,000 VDC capacitor that can store at least 10,000 Joules of energy. In such cases, the threshold voltage charge level or energy accumulation level before the warning circuit is activated is set at a level that would be harmful to human operators.

In other embodiments, the charged state is configured such that the warning circuit is activated at levels below those levels that would be considered harmful to human operators. For example, in some applications, for example, use in a fuel refinery or some medical applications, it is important that the capacitor 101 be completely discharged in order to avoid small unwanted electrical discharges (e.g., a spark) through contact with the terminals 103, 104. Such a spark could ignite a fire, for example. In such cases, it may be helpful to know when the capacitor has discharged to a level below a very low voltage level, such as below a few volts, e.g., less than 3 volts. In such cases, the threshold voltage charge level or energy accumulation level defining the charged state when the warning circuit is activated is set at a low level near the fully discharged state in order to provide an indication that the capacitor 101 is in condition to provide an unwanted electrical discharge. Thus, the voltage threshold or accumulated energy level of the capacitor 101 defining the charged state when the warning circuit is powered and activated depends on the application.

In another embodiment, the flashing of the lamp and/or the pulsing of the warning circuit will stop pulsing and operate continuously once capacitor 101 is above a threshold voltage where that will occur.

It is noted that in the embodiment of FIG. 1, the warning circuit is contained within the case 102 such that the warning circuit is embedded within the capacitor. For example, in some embodiments, the warning circuit is sealed within the capacitor case 102. However, in other embodiments, at least a portion of the warning circuit may be located external to the case 102. In one embodiment, the portion of the warning circuit outside of the case 102 is only the low current portions of the warning circuit. For example, the two high voltage resistors 107 and 108 are implemented within the case 102 and the other components are outside of the case 102 (see the embodiment of FIG. 6). Additionally, it is noted that the lamp 110 and the buzzer 112 may be generically referred to warning indicators that provide an indication that the capacitor 101 is in a charged state as opposed to a non-charged state. Further, the lamp 110 is an example of a visible indicator, i.e., an indicator that provides a visible indication that the capacitor 101 is in a charged state or not. Other forms of visible indicators known to those of ordinary skill in the art may be provided instead of or in addition to the lamp 110, including light emitting diodes (LEDs), for example. Additionally, the buzzer 112 is an example of an audible indicator, i.e., an indicator that provides an audible indication that the capacitor 101 is in a charged state or not. Other forms of audible indicators known to those of ordinary skill in the art may be used instead of in addition to the buzzer 112. For example, in one embodiment, the audible indicator comprises a solenoid and a mechanically actuated device that is in contact with a portion (e.g., interior portion) of the case 102. In this embodiment, the solenoid actuates the device causing it to repeatedly impact a surface resulting in an audible indication of that the capacitor is in the charged state, e.g., the operator hears a clicking, thumping or banging noise. In further embodiments illustrated below, the warning circuit may also include an electromagnetic indicator that provides an electromagnetic indication that the capacitor 101 is in a charged state or not. For example, an electromagnetic transmitting device such as a radio frequency transmitter may be used.

Figure 2:
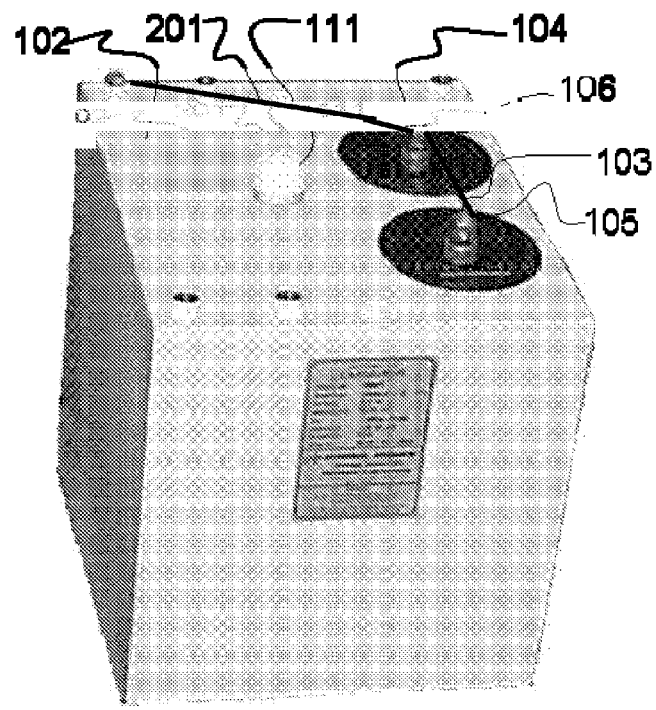
FIG. 2 is a depiction of the outside of one embodiment of a typical capacitor where an indicating lamp from the capacitor charge warning system is visible near the terminals of the capacitor.

FIG. 2 illustrates one exemplary layout for the circuit of FIG. 1 where the location of the lens 111 through which lamp 110 is visible outside the capacitor case 102 and is located near the high voltage terminals 103 and 104. In this embodiment, the warning circuit is integrated within and sealed within the case 102. Again, the warning circuit is powered by energy accumulated in the capacitor 101 when the capacitor 101 is in the charged state. Also shown in is a shorting wire 201 between the capacitor case 102 and the terminals 103 and 104. Shorting wires 201 are commonly used when the capacitor 101 is not energized for safety reasons.

Figure 3:
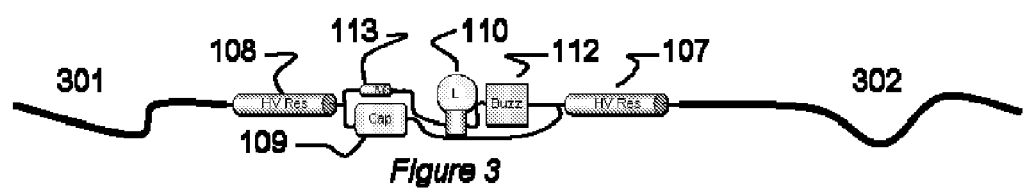
FIG. 3 is a typical component layout for one embodiment of the warning circuit as might be installed given the schematic of FIG. 1.

FIG. 3 is a typical discrete component layout for one embodiment of the capacitor warning circuit of FIG. 1. The lead wires 301 and 302 on the outside of the high voltage resistors 107 and 108 are typically high voltage insulated leads and are coupled to either end of the capacitor 101. The high voltage insulation is sometimes extended over the high voltage end of the high voltage resistors 107 and 108.

Figure 4:
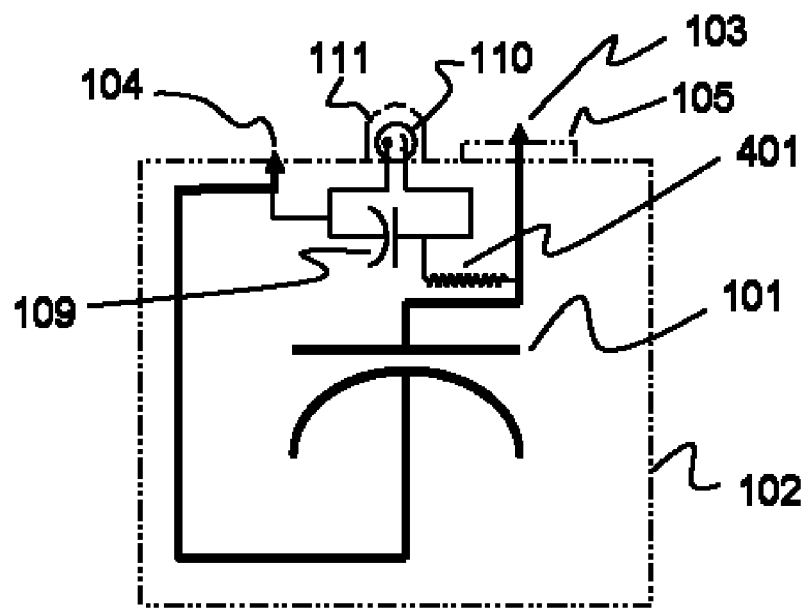
FIG. 4 is a schematic of another embodiment of a charged capacitor warning circuit for a high voltage high energy capacitor where one of the high voltage high energy capacitor terminals is connected to the case of the capacitor.

FIG. 4 is a schematic of another embodiment of a charged capacitor warning circuit for a high voltage high energy capacitor where one of the high voltage terminals 104 is connected directly to the capacitor case 102. In this configuration, there is no advantage in having a high voltage resistor between the terminal 104 and the warning circuit which includes capacitor 109 and neon lamp 110. It should be noted that the buzzer 112 and the indicating lamp 110 need not both be included in a warning circuit and in this case, only the lamp 110 is included. Thus, in accordance with some embodiments, the warning system includes one or more of a visible indictor, an audible indicator and an electromagnetic indicator. If the warning circuit is to have the same performance as the warning circuit of FIG. 1, the value of the high voltage resistor 401 should be the sum of the high voltage resistors 107 and 108 in FIG. 1, for example, 100,000,000 ohms. The warning circuit of FIG. 4 operates similarly as the warning circuit of FIG. 1 in that as the capacitor 101 voltage reaches an unsafe level, current will flow in the warning circuit to charge the capacitor 109, which will then discharge to flash the lamp 110. The cycle will repeat, thus, repeatedly flashing the lamp 110 providing a visible warning indication to an operator that the capacitor 101 is in a charged state in which is it not safe to come into contact with the terminals 103, 104. Alternatively, the warning circuit of FIG. 4 may be configured to be activated when the charged state of the capacitor 101 is at a level other than when it is considered harmful to a human operator depending on the application. For example, as discussed above, in some applications, the warning circuit is provided to indicate that the capacitor 101 has enough of a charge to possibly result in an unwanted electrical discharge if contact is made with a terminal 103, 104. The values of the components of the warning circuit are so selected to cause activation at the appropriate voltage charge level or energy accumulation level.

Figure 5:
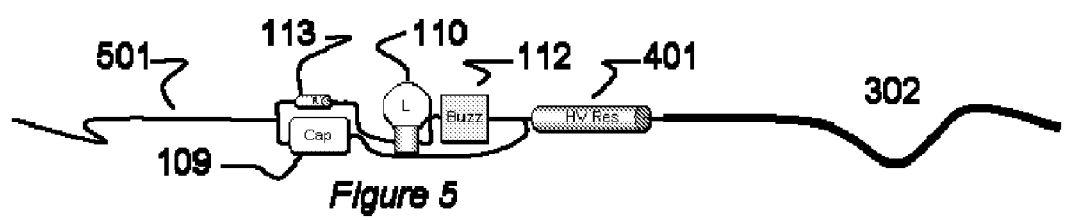
FIG. 5 is a typical component layout for one embodiment of the schematic of FIG. 4.

FIG. 5 is a discrete component layout for one embodiment of the warning circuit of FIG. 4, in this case, including the audible indicator (buzzer 112). The lead wire 501 is coupled to the capacitor case 102 and the lead wire 302 is coupled to the positive side of the capacitor 101. For this circuit, the warning circuit lead wire 501, as well as the rest of the warning circuit does not need high voltage insulation between the warning circuit and the capacitor case 102.

Figure 6:
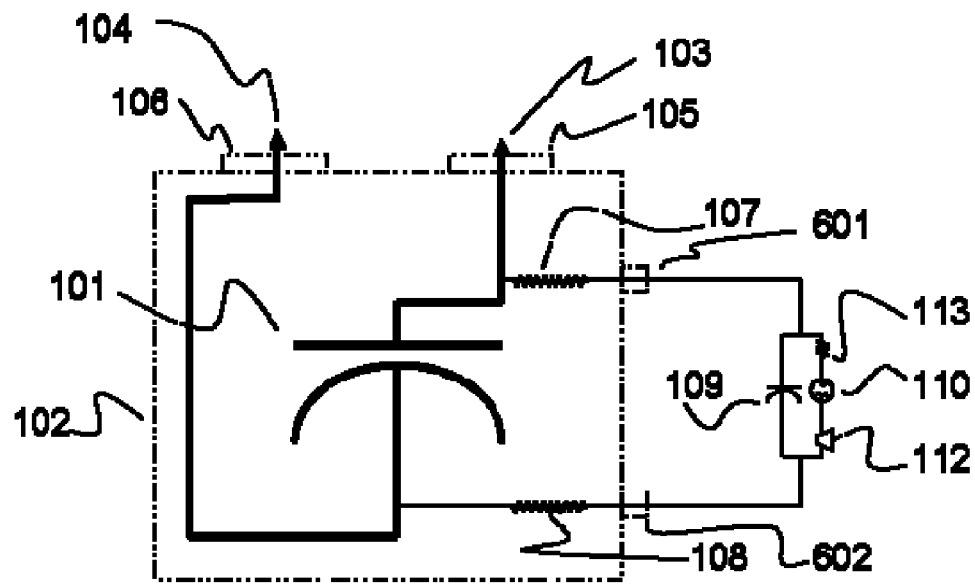
FIG. 6 is a variation of the warning circuit of FIG. 1 where the high voltage resistors are enclosed in the capacitor case but the low current warning circuit is outside the capacitor case.

FIG. 6 is another embodiment of the capacitor warning circuit where at least some of the components of the warning circuit are located outside of the capacitor case 102. In the illustrated embodiment, the capacitor 109, the lamp 110, the buzzer 112 and the ballast resistor 113 are located outside of the case 102. The high voltage resistors 107 and 108 are inside the capacitor case 102 with the low current fed through the case via high voltage, low current, insulating bushings 601 and 602. The low current which in this example would be 0.0002 Amp maximum and 0.0001 Amp nominal, is small enough that it would not pose as serious a hazard to persons coming into incidental contact with the warning circuit. Thus, the low current portion of the circuit can be operated outside the capacitor case 102 with relative safety even though the capacitor 101 is operating at high voltage. That is, the resistors 107 and 108 are sealed within the case 102 whereas the remaining components are outside of the case 102.

Figure 7:
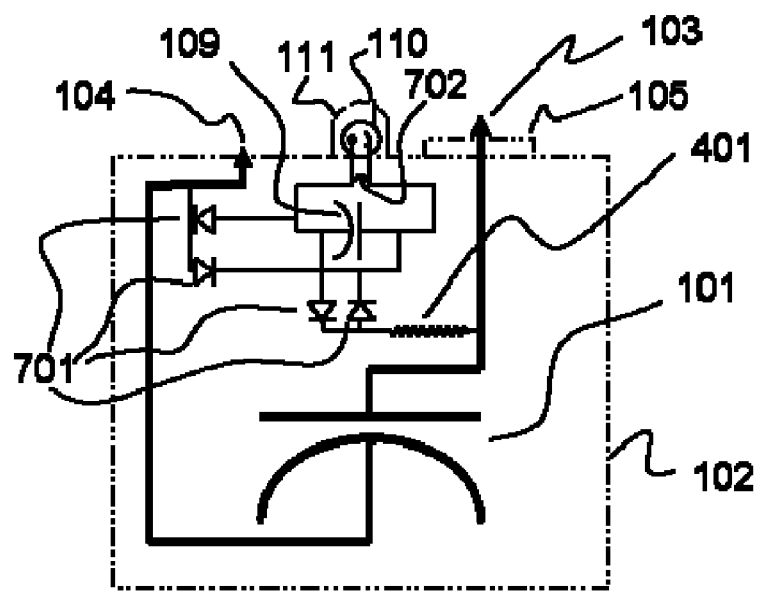
FIG. 7 is another embodiment of a warning circuit for a capacitor similar to the embodiment of FIG. 4 except that a low voltage bridge rectifier has been added so that the warning circuit will function for capacitors when either AC or DC voltage is applied.

FIG. 7 is another embodiment of a capacitor warning circuit for a capacitor similar to the embodiment of FIG. 4. In this embodiment, a bridge rectifier 701 has been added so the warning circuit will work when the capacitor 101 is subjected to either AC or DC charging voltage. The bridge rectifier 701 extends the functionality of all the circuits shown herein to capacitors 101 that are operated under a condition other than DC voltage. If the other circuits shown are operated on an AC circuit without a rectifier circuit, energy is not likely to accumulate in the warning circuit to the point where it will cause the relaxation oscillators to function. The warning circuit will start to function if AC power is removed from the capacitor 101 at a normal current zero where peak voltage would be left on the capacitor 101 and thus look like a DC voltage to the warning circuit.

The embodiment of FIG. 7 has another feature. It is a small low voltage resistor 702 that is connected in parallel with the neon lamp 110. This resistor 702 allows the voltage on the capacitor 101 to continue to bleed down when the voltage on capacitor 101 is below the minimum operation voltage of the neon lamp 110.

Figure 8:
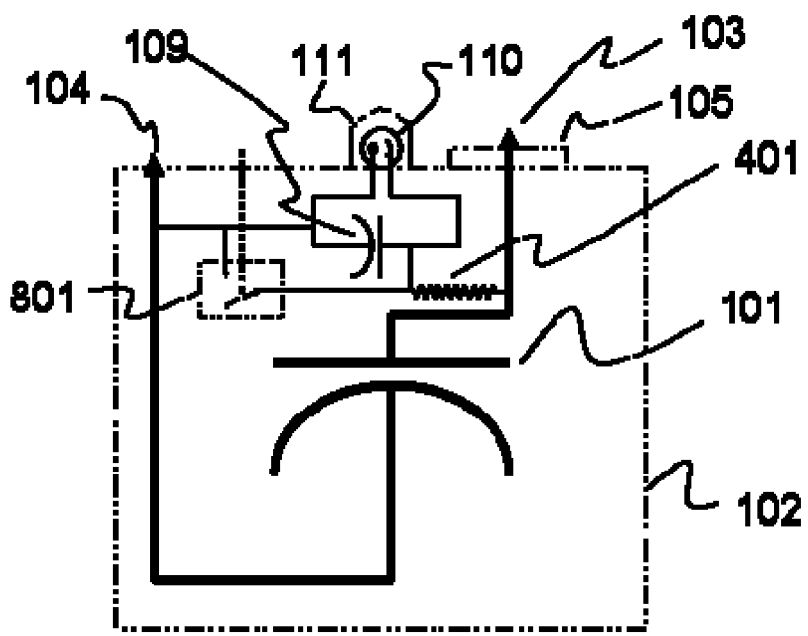
FIG. 8 is a further embodiment of a warning circuit for a capacitor similar to the embodiment of FIG. 4 and including a switch to disarm the warning circuit.

FIG. 8 is a further embodiment of a warning circuit for a capacitor similar to the embodiment of FIG. 4 and includes a switch to disarm the warning circuit. A low current switch 801 has been added to the warning circuit that can be used to disarm the warning system. In some applications, it may be desirable to not advertise the fact that the capacitor 101 is charged. Such disarming switches can be used to disable the lamp 110 (i.e., the visible indication), the audible indication, or the electromagnetic indication, or any combination thereof. The switch 801 may reside inside the capacitor case 102 or outside the capacitor case 102 and can be controlled mechanically or electrically. It is noted that in the embodiment of FIG. 8, one of the high voltage connections is connected to the case 102 as in the embodiment of FIG. 4, but that is not necessary. Switch 801 could be added to any of the warning circuits described herein.

Figure 9:
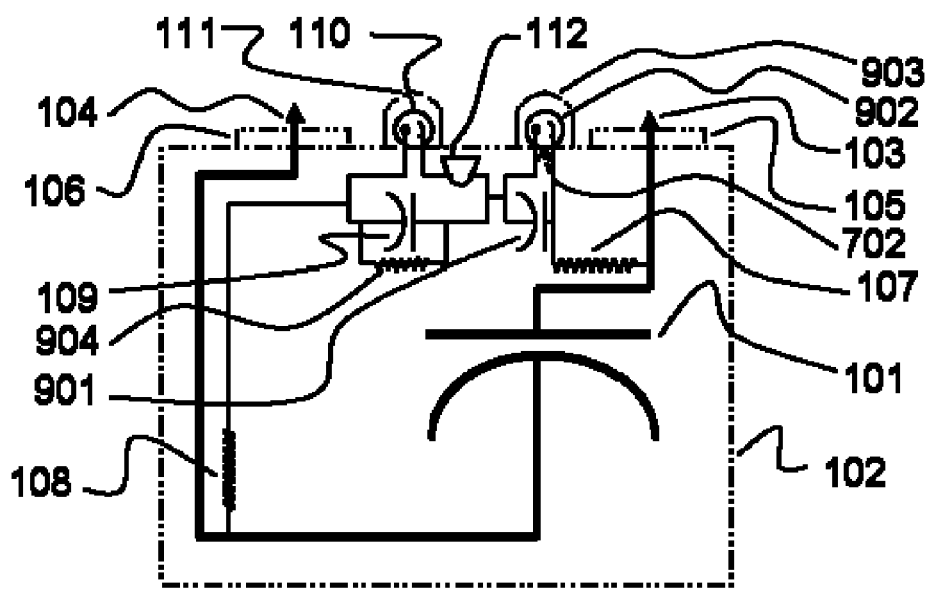
FIG. 9 is another embodiment of a warning circuit for a capacitor where the warning circuit includes more than one low voltage oscillating circuits to provide pulsating signals when the capacitor is fully charged and when it is near the minimum voltage of the circuit.

FIG. 9 is another embodiment of a warning circuit for a capacitor where the warning circuit includes more than one low voltage oscillating circuit to provide pulsating signals when the capacitor is fully charged and when it is near the minimum voltage of the circuit. For example, the circuit of FIG. 9 is similar to the circuit of FIG. 1 but with a second relaxation oscillator circuit comprising of capacitor 901, lamp 902, and lens 903. Since the two relaxation oscillator circuits are in series they both see the same current. In this embodiment, capacitor 901 is significantly smaller than capacitor 109 and the lamps 110 and 902 operate at approximately the same voltage. As a result of the difference in size between capacitors 109 and 901, lamp 902 will flash faster than lamp 110. Also, since capacitor 109 is larger than capacitor 901 there will be more energy to flash lamp 110 and buzzer 112 than is available to flash lamp 902. At maximum circuit voltage, it is likely that the current through the circuit made up of resistors 107 and 108, capacitor 109, and lamp 902 will be high enough that lamp 902 will remain on continuously. When the voltage on capacitor 101 approaches the minimum operating voltage of the warning circuit, lamp 110 and buzzer 112 may be operating with long intervals while lamp 902 has a short flash interval. Thus, this embodiment provides an indication to the user based on the illuminations of the lamps 110 and 902 at what point the capacitor 101 is within the charged state, e.g., if lamp 902 is continuously illuminated, the capacitor 101 is in a fully charged state. On the other hand, if lamp 902 is not continuously illuminated and lamp 110 is illuminating at long intervals, then the capacitor 101 is near a voltage threshold or minimum operating voltage of the warning circuit.

Also illustrated in the embodiment of FIG. 9 is resistor 904 which has been added in parallel with capacitor 109. This resistor 904 will increase the flash interval of lamp 110 and buzzer 112. Once the voltage on capacitor 101 has dropped below the point where both circuits can continue to oscillate, resistor 904 will allow the relaxation oscillator made up of capacitor 901 and lamp 902 to continue to operate until the voltage on capacitor 101 drops below the minimum operating voltage of that circuit. Resistor 904 can also be used to make sure that the buzzer 112 keeps oscillating with high voltages on capacitor 101. If the lamp 110 stays on and leakage current through the buzzer 112 is not high enough, the buzzer 112 goes silent. In one example, the resistor 904 is a 20 MOhm low voltage resistor to accomplish this function.

Also, at low voltages, when the buzzer circuit stops working due to falling below the minimum threshold of the lamp 110, the series flashing circuit will also stop. With neon lamps, when the sum of the voltages on the two capacitors in series reaches the minimum operating voltage of either of the lamps 110 and 902, this is likely too happen. With the resistor 904 in place, the fast flashing lamp 902 keeps operating.

Also, in some embodiments, it may be important to drain all of the charge off all the capacitors 109 and 901 in the warning circuit. In some locations, the capacitors that might be used could be very sensitive to even low voltage arcs. For example, low voltage arcs could be a problem at a fuel depot. The resistors 904 and 702 would assure that eventually the voltage on capacitor 101 and the small capacitor 901 in the warning circuit will continue to drain toward zero volts and eventually go to zero. This is helpful in applications where the warning circuit is implemented in equipment that is very likely to receive heavy damage (e.g., combat or military applications).

There are many combinations of circuits that can be used to enhance the performance of the warning circuit powered by the charge stored in the capacitor 101. In some embodiments, the oscillators discussed thus far will oscillate faster as the voltage is increased on capacitor 101. With the circuit of FIG. 9, the number of lamps flashing provides an indication of the voltage on capacitor 101. This technique can be extended in further embodiments by adding more circuits so that the number of lamps flashing (or other visible, audible and/or electromagnetic indicators) will indicate the voltage on capacitor 101.

While the circuits discussed thus far all use simple relaxation oscillators, there are other low voltage warning circuits that can be used to drive the warning indication devices. Electronic circuits (such as a semiconductor electronic integrated circuit) can be designed to generate more signal in terms of sound or light or electromagnetic energy with power from capacitor 101 than could be accomplished with a neon lamp relaxation oscillator. In one embodiment, visible indicators are high efficiency LEDs. The operating voltage of such an electronic circuit is far more flexible than a neon lamp and can be designed to operate at lower minimum voltages which for a typical neon lamp could be in the 100 volt range. While the neon lamp circuit shown here is simple, electronic circuits can be designed to be more reliable that a neon lamp circuit thus increasing the mean time between failures. Such design is within the abilities of one or ordinary skill in the art.

The warning or indication signals discussed thus far include visual/visible, audible and/or electromagnetic. An electromagnetic indication could be a generated radio wave that can be identified at a remote location thus signaling that the capacitor 101 is in the charged state. In one embodiment, the electromagnetic feedback can be coupled to the high voltage terminals 103 and 104 of the capacitor 101 or could be radiated much the way light is radiated by the neon lamp 110.

Figure 10:
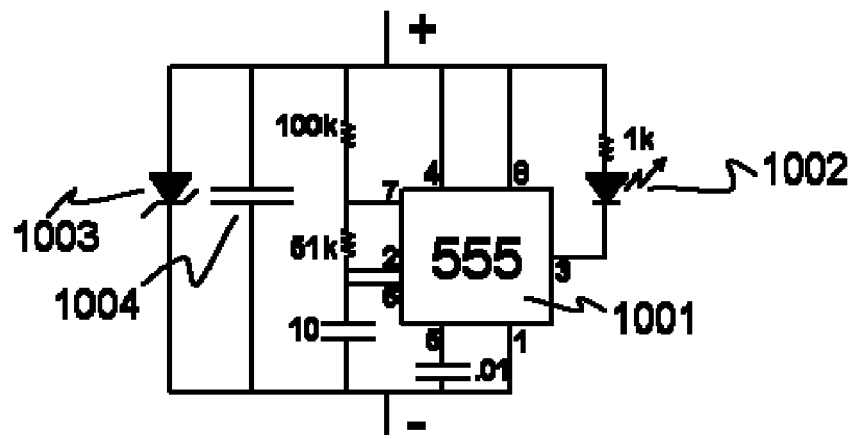
FIG. 10 is one embodiment of a relaxation oscillator based on a 555 timer.

FIG. 10 is one embodiment of a relaxation oscillator that is based on a 555 timer 1001 that is driving a LED 1002. This embodiment provides a semiconductor electronic integrated circuit embodiment of a relaxation oscillator. The voltage for this type of circuit is typically 12 volts. A Zener diode 1003 that conducts at 12 volts is used in conjunction with a 12 volt storage capacitor 1004 to provide the power needed to drive the oscillator. While this circuit is illustrated as driving the LED 1002, it could also be driving a buzzer 112 (audible indicator) or an electromagnetic radiation device.

Figure 11:
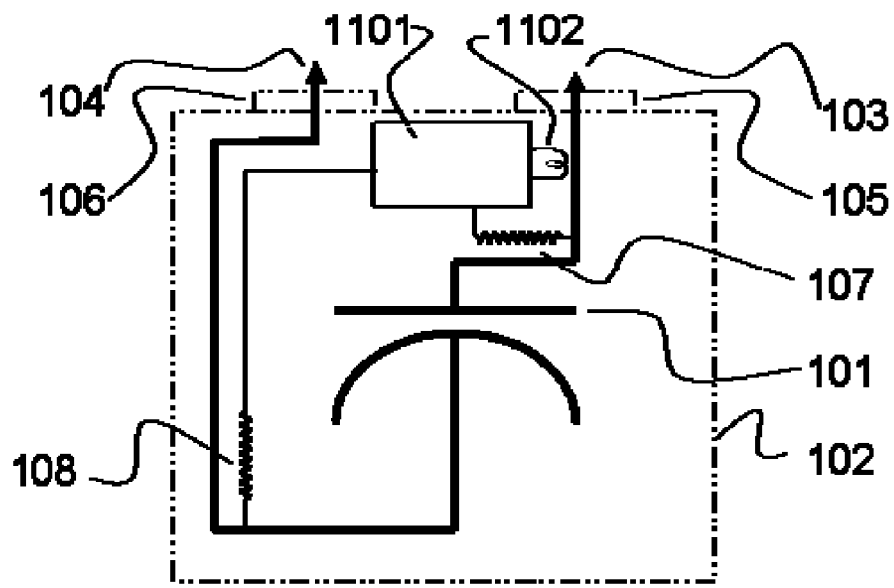
FIG. 11 is a further embodiment of a warning circuit where the output of the oscillator circuit is an electromagnetic signal that is coupled to the high voltage capacitor terminals.

FIG. 11 is a further embodiment of a warning circuit based on an electromagnetic warning signal. The oscillator 1101 could be one of many common oscillator circuits such as a Clapp oscillator, Armstrong oscillator, or op amp hysteretic oscillator that could be used in this configuration by one skilled in the art. The electromagnetic signal is coupled to terminal 103 via an inductive coupling device 1102. The electromagnetic signal can then be sensed by a remote monitor such as a radio indicating that there is voltage on the capacitor, i.e., the capacitor 101 is in a charged state. The remote monitor could be connected directly to the capacitor terminal 103 or the capacitor terminal could be used as an antenna broadcasting the signal though the air.

Figure 12:
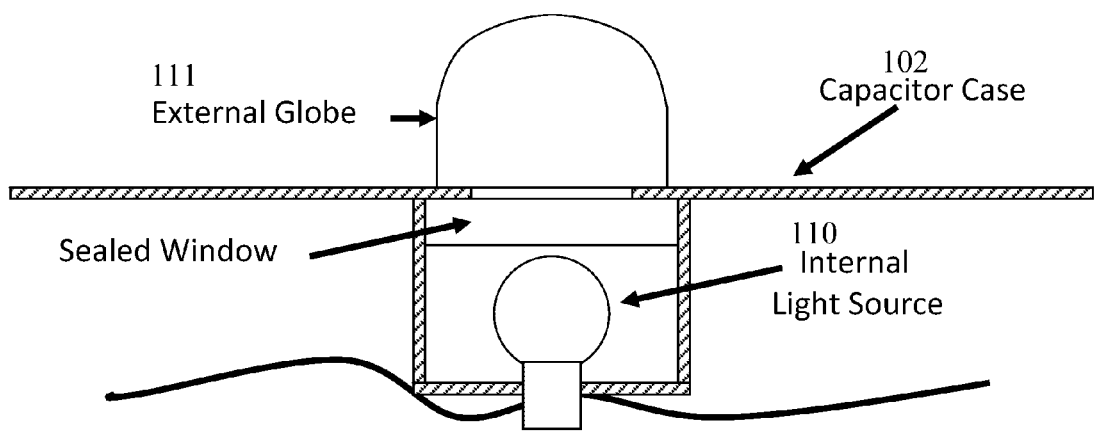
FIG. 12 is an illustration of one embodiment of the capacitor case of FIG. 2 where the lamp is located within the capacitor case and the lens is formed as an external globe extending outside of the capacitor case.

Referring next the embodiment of FIG. 12, one embodiment of the capacitor case 102 of FIG. 2 is illustrated in which the lamp 110 is located within the capacitor case 102 and the lens 111 is formed as an external globe extending outside of the capacitor case 102. The lamp 110 is formed in a volume that is sealed from the remaining interior volume of the capacitor case, protecting the lamp from the oil filled volume of the capacitor case. If, accidentally, the lens is knocked off, the seal between the inside of the capacitor and the outside will not be broken and the oil will not leak out.

Figure 13:
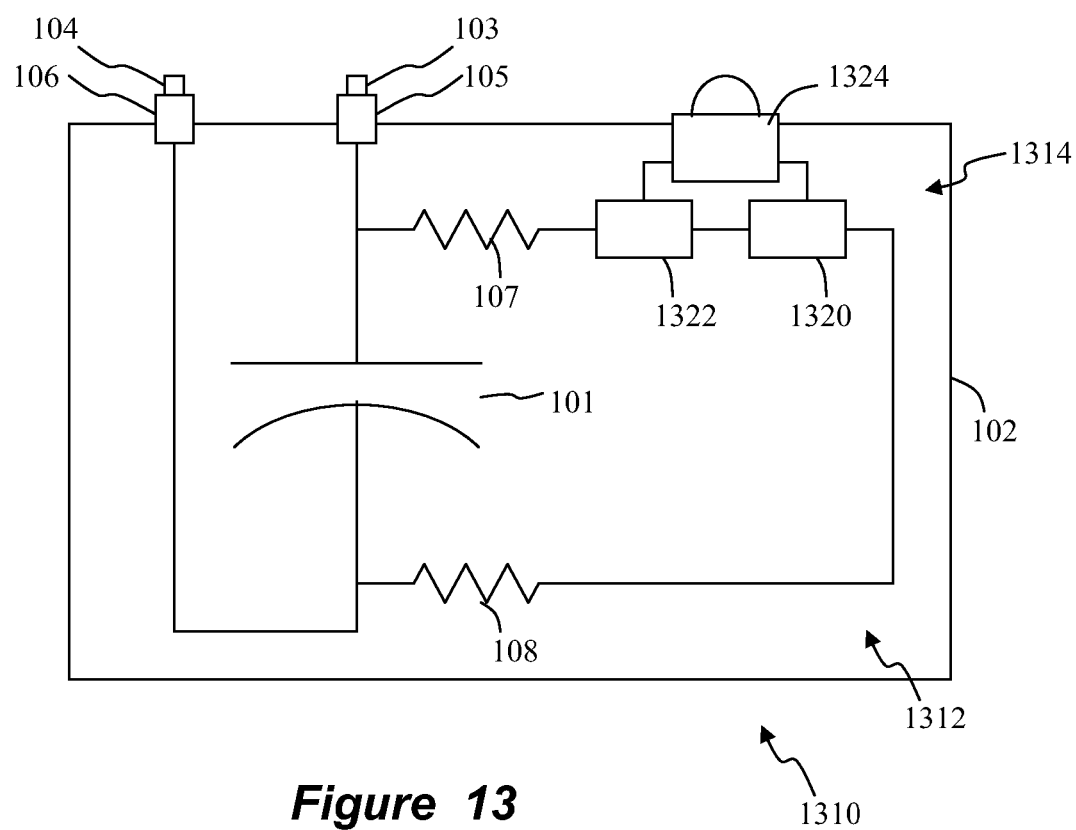
FIG. 13 is another embodiment of a capacitor system or capacitor warning system or circuit according to some embodiments.

FIG. 13 is another embodiment of a capacitor system or capacitor warning system or circuit 1310 according to some embodiments. The capacitor system 1310 includes a capacitor circuit 1312 incased in a housing or case 102 with two terminals 103 and 104 fed through bushings 105 and 106, respectively. The capacitor system 1310 includes a high voltage high energy storage capacitor 101 with two high voltage resistors 107 and 108 coupled to either side of the energy storage capacitor 101. The resistors 107 and 108 allow a small maximum current to flow through the resistors and be available to a warning circuit 1314. The warning circuit 1314 includes a first relaxation oscillator circuit 1320, a second relaxation oscillator circuit 1322 and warning indicator circuitry 1324. The first and second relaxation oscillator circuits 1320, 1322 may also be referred to as low current circuits, low voltage circuits or signal circuits.

The first and second relaxation oscillator circuits 1320, 1322 are powered by energy accumulated in the capacitor 101 when the capacitor is charged or carries a charge. In one exemplary embodiment, the first relaxation oscillator circuit 1320 operates at a lower voltage threshold than the second relaxation oscillator circuit 1322. As such, the first relaxation oscillator circuit 1320 activates the warning indicator circuitry 1324 when the capacitor 101 is charged to or exceeds a first charged state. Similarly, the second relaxation oscillator circuit 1322, which in some instances may be referred to as a charged indicator activation circuit, activates the warning indicator circuitry 1324 when the capacitor 101 is charged to or exceeds a second charged state or threshold, where the second charged state is greater than the first charged state, and in some instances may be referred to as a high voltage indicator activation circuit. As one specific example, the first charged state may correspond to and represent a stored energy level in which the capacitor 101 would be harmful to a human operator through inadvertent contact with terminals 103, 104 of the capacitor 101; and the second charged state may correspond to and represent a stored energy level in which the capacitor 101 is lethal to a human operator through inadvertent contact with terminals of the capacitor and/or where the capacitor is discharged through the operator. It is noted that the second stored energy level is, in many instances, less than a maximum charge of the capacitor 101.

Further, in some instances, the first relaxation oscillator circuit 1320 activates the warning indicator circuitry 1324 to provide a first indication, such as a first illumination of a light with a first color, while the second relaxation oscillator circuit 1322 activates the warning indicator circuitry 1324 to provide a second indication, such as a second illumination of a light with a second color that is different than the first color, that may be brighter than the first illumination, that may appear to be continuously on while the first illumination appears to flash, or other such differences or combinations of such differences. Additionally or alternatively, audible indicators, other visible indicators, electromagnetic indicators or other such indicators or combinations of such indicators can be activated.

In some embodiments, the warning circuit 1314 provides pulsating signals when the capacitor 101 is at or above the first charged state, which may include when the capacitor 101 is near a minimum voltage of the first relaxation oscillator circuit 1320, such that the first relaxation oscillator circuit 1320 in cooperation with the warning indicator circuitry 1324 is sometimes referred to as a low voltage, fast flashing circuit. Further, the warning circuit 1314 can provide pulsating signals when the capacitor 101 at a second threshold at or above the second charged state, which may include when the capacitor 101 is at a level that can result in significant harm (which in some instances is not a maximum level), such that the second relaxation oscillator circuit 1322 in cooperation with the warning indicator circuitry 1324 is sometimes referred to as a height voltage, slow flashing circuit. As with FIG. 9, the first and second relaxation oscillator circuits 1320, 1322 are in series, and as such both see the same current.

Figure 14:
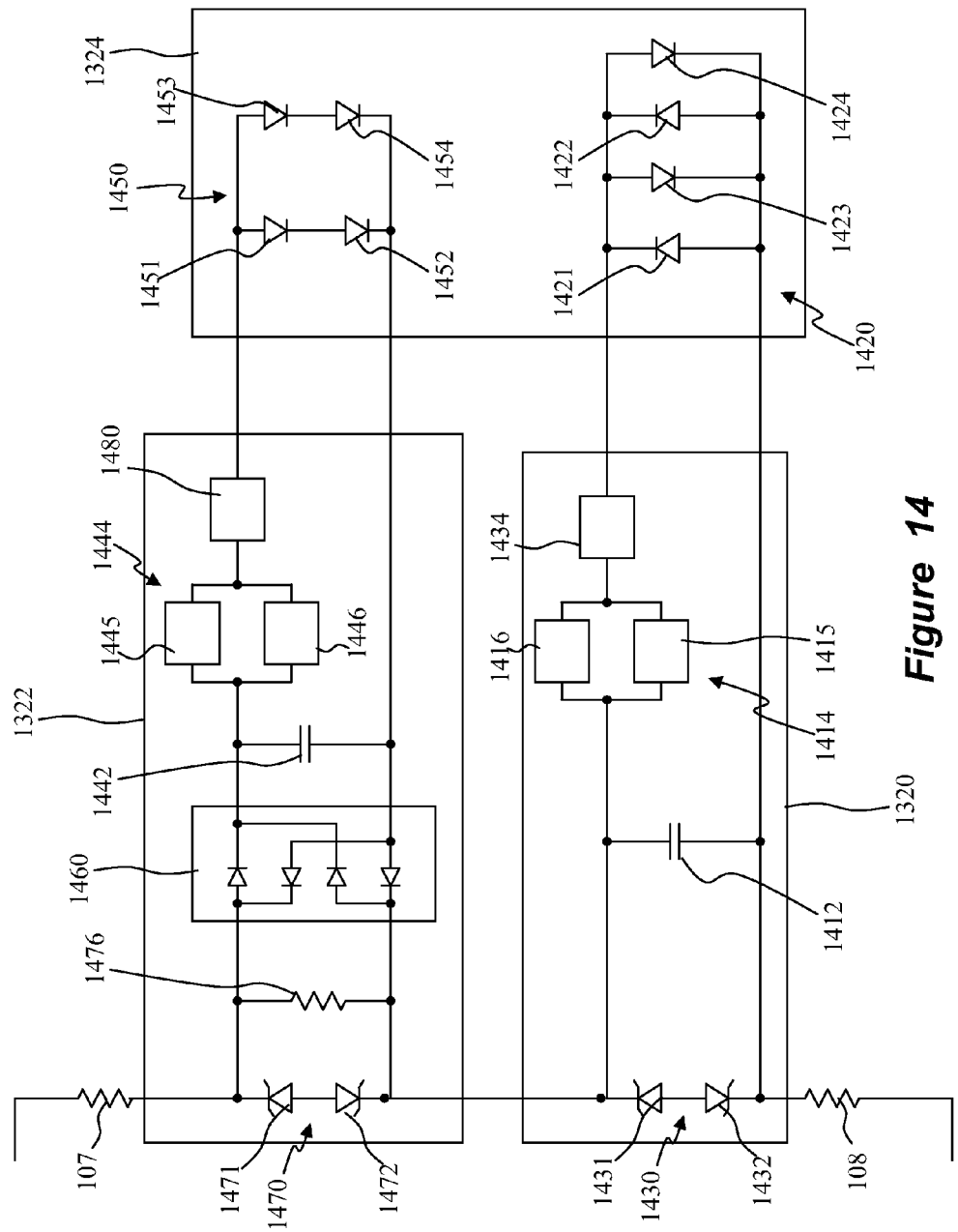
FIG. 14 is a schematic illustration of one embodiment of the first relaxation oscillator circuit, the second relaxation oscillator circuit, and the warning indicator circuitry of FIG. 13.

Referring next to the embodiment of FIG. 14, one embodiment of the first relaxation oscillator circuit 1320, the second relaxation oscillator circuit 1322, the warning indicator circuitry 1324 of FIG. 13 are schematically illustrated in which the first relaxation oscillator circuit 1320 and the second relaxation oscillator circuit 1322 are coupled in series with the high voltage resistors 107 and 108, and further coupled with the warning indicator circuitry 1324. The first relaxation oscillator circuit 1320 includes a first relaxation oscillator capacitor or set of capacitors 1412 and a first switch circuit 1414. In some embodiments, the first relaxation oscillator circuit 1320 can include a first open circuit protection circuitry 1430, and further may include a jumper 1434, coupling, ballast resistor and/or other such circuitry. The first relaxation oscillator capacitor 1412 is charged from the energy of the capacitor 101 and discharges through the first switch circuit 1414 to activate a first warning indicator circuit 1420 of the warning indicator circuitry 1324.

Similarly, the second relaxation oscillator circuit 1322 includes a second relaxation oscillator capacitor or set of capacitors 1442 and a second switch circuit 1444. In some embodiments, the second relaxation oscillator circuit 1322 can include a rectifier circuit 1460, a second open circuit protection circuitry 1470, a pass resistor 1476, and further may include a jumper 1480, coupling, ballast resistor and/or other such circuitry. The second relaxation oscillator capacitor 1442 is charged from the energy of the capacitor 101. Further, the second relaxation oscillator capacitor 1442 discharges through the second switch circuit 1444 to activate a second warning indicator circuit 1450 of the warning indicator circuitry 1324.

In this embodiment, the first relaxation oscillator capacitor 1412 is smaller than the second relaxation oscillator capacitor 1442, while and first and second switching circuits 1414, 1444 activate the first warning indicator circuit 1420 and the second warning indicator circuit 1450, respectively. In one example, the first relaxation oscillator capacitor 1412 is a 0.1 microfarad capacitor and the second relaxation oscillator capacitor 1442 is a 4.7 microfarad capacitor. As a result of the difference in size between the first and second relaxation oscillator capacitors 1412 and 1442, the first warning indicator circuit 1420 is activated by the first relaxation oscillator circuit 1320 at lower voltage levels on the capacitor 101, and thus, earlier in the charging cycle. In some embodiments, because the second relaxation oscillator capacitor 1442 is larger than the first relaxation oscillator capacitor 1412 there will be more energy supplied to the second warning indicator circuit 1450 and may generate a brighter and/or louder notification than that produced by the first warning indicator circuit 1420 driven by the first relaxation oscillator capacitor 1412.

Also illustrated in the embodiment of the second relaxation oscillator circuit 1322 of FIG. 14 is resistor 1476. The resistor 1476 is added in parallel with the second relaxation oscillator capacitor 1442, and increases the voltage at which the second relaxation oscillator circuit 1322 is activated to trigger the warning indicator circuitry 1324. In some embodiments, the resistor 1476 is configured with an impedance that allows the first relaxation oscillator circuit 1320 to operate substantially any time a voltage across the capacitor 101, even when voltage levels across the capacitor 101 drop to levels where the second relaxation oscillator circuit 1322 shuts off or no longer activates the warning indicator circuitry 1324, and further allows the first relaxation oscillator circuit 1320 to continue to operate and allows the first relaxation oscillator capacitor 1412 to be charged and activate the warning indicator circuitry 1324. In one example, the resistor 1476 can have about an 11 MOhm resistance.

In operation the first warning indicator circuit 1420 is coupled in parallel with the first relaxation oscillator capacitor 1412 and is activated when the first switch circuit 1414 is activated. In some embodiments, the first switch circuit includes a first switch 1415, which in some instances can be implemented through a neon lamp (which can be similar to those described above). Upon activation of the first switch 1415 current is drawn by the first warning indicator circuit 1420 from the first relaxation oscillator capacitor 1412 to generate an indication that the capacitor 101 contains a charge, and in some instances a charge that is above a first charged state or threshold, and can indicate a state that can be harmful to a human operator through inadvertent contact with terminals of the capacitor.

In some embodiments, the first warning indicator circuit 1420 comprises a polarity circuit that indicates a polarity with which a charging source is coupled across the capacitor 101 in charging the capacitor. In an exemplary embodiment, the polarity circuit comprises at least a first LED indicator 1421 and a second LED indicator 1423. The first LED indicator 1421 is coupled across the first relaxation oscillator capacitor 1412 in a first orientation and is illuminated when the charging source is coupled with the capacitor 101 in a first polarity. Further, in some instances, the first LED indicator 1421 can generate a first colored illumination (e.g., blue). In the embodiment depicted in FIG. 14 the first LED indicator 1421 is illuminated when the charging source is coupled in a reverse polarity with the capacitor 101, which in some instances may reduce a life expectancy of one or more components of the capacitor system 1310 (e.g., the first and/or second relaxation oscillator capacitors 1412, 1442). Similarly, the second LED indicator 1423 is coupled across the first relaxation oscillator capacitor 1412 in a second orientation and is illuminated when a charging source is coupled with the capacitor 101 in a second polarity. Additionally, the second LED indicator 1423 can generate a second colored illumination (e.g., green). In the embodiment depicted in FIG. 14 the second LED indicator 1423 is illuminated when the charging source is coupled in a positive polarity with the capacitor 101. Further still, the first relaxation oscillator circuit 1320 can activate the polarity circuit at relatively low voltages providing early indication of the polarity and can, in some instances, cause the first or second LED indicators 1421, 1423 to blink in their respective color depending on the detected polarity.

Further, the first relaxation oscillator circuit 1320 can include the open circuit protection circuit 1430. Because the first relaxation oscillator circuit 1320 is operated within the capacitor case 102 and at a relatively low voltage, at least relative to the potential of the terminal voltage of the capacitor 101, which can be 10,000 volts or more, the first relaxation oscillator circuit 1320 has the potential of jumping or arching to an open circuit in what should be a relatively low voltage circuit. If the first relaxation oscillator circuit 1320 attempts to go open circuit it would typically need to achieve the terminal voltage of the capacitor 101, again which could be 10,000 volts or more, and is likely to arc over before getting to the terminal voltage of the capacitor 101. The first open circuit protection circuit 1430 provides protection to minimize this possibility. In some embodiments, the first open circuit protection circuit comprises first and second Zener diodes 1431, 1432 set back-to-back and in parallel with the first relaxation oscillator capacitor 1412 to limit the voltage that will be seen by the first relaxation oscillator circuit 1320 if for some reason the first relaxation oscillator circuit attempted to go open circuit. As such, the first protection circuit 1430 limits the maximum voltage across the first relaxation oscillator circuit 1320.

In some embodiments, the capacitor circuit 1312 can further include failure protection circuitry. In one embodiment, failure protection circuitry can include a first failure protection circuitry within the first relaxation oscillator circuit 1320 and first warning indicator circuit 1420. The first failure protection circuit provides for an additional second switch 1416 within the first switch circuit 1414, where the second switch 1416 is coupled in parallel with the first switch 1415 providing an alternate path in an event of a failure of the first switch 1415 (or vise versa), with little or no external effect on the capacitor system 1310. As with the first switch, in some embodiments, the second switch 1416 of the first switch circuit 1414 can be implemented through a neon lamp. Further, the first protection circuit can extend to the first warning indicator circuit 1420 to include a third LED indicator 1422 that is oriented in the same first orientation as the first LED indicator 1421 (providing the same color illumination as the first LED indicator), and a fourth LED indicator 1424 that is oriented in the same second orientation as the second LED indicator 1423 (providing the same color illumination as the second LED indicator). As such the third and fourth LED indicators 1422, 1424 provide redundant indicators in an event of a failure, and thus, protecting against an open circuit failure.

Regarding the second relaxation oscillator circuit 1322 and the second warning indicator circuit 1450, in operation the second warning indicator circuit 1450 is coupled in parallel with the second relaxation oscillator capacitor 1442 and is activated when the second switch circuit 1444 is activated. In some embodiments, the second switch circuit includes a first switch 1445, which similar to the first switch circuit 1414 can be implemented in some implementations through a neon lamp. Upon activation of the first switch 1445 of the second switch circuit 1444 current is drawn by the second warning indicator circuit 1450 from the second relaxation oscillator capacitor 1442 to generate an indication that the capacitor 101 contains a charge that is above a second charged state or threshold, which is greater than the first charged state, and typically is highly dangerous and often lethal to a human operator through inadvertent contact with terminals of the capacitor.

In some embodiments, the second warning indicator circuit 1450 further includes a rectifier circuit 1460, which in some instances can be similar to the bridge rectifier 701 of FIG. 7. The rectifier circuit 1460 allows the warning circuit 1314 to work when the capacitor 101 is subjected to either AC or DC charging voltage, and can extend the functionality of the circuits. Again, in some embodiments, the rectifier circuit 1460 is implemented through a bridge rectifier, which in some instances is implemented with four diodes.

Similar to the first relaxation oscillator circuit 1320, the second relaxation oscillator circuit 1322, in some embodiments, includes the second open circuit protection circuit 1470. Because the second relaxation oscillator circuit 1322 is also operated within the capacitor case 102 and at a relatively low voltage, the second relaxation oscillator circuit 1322 similarly has the potential of jumping or arching to an open circuit and attempting to achieve the terminal voltage of the capacitor 101. The second open circuit protection circuit 1470 provides protection to minimize this possibility. In some embodiments, the second open circuit protection circuit 1470 comprises third and fourth Zener diodes 1471, 1472 set back-to-back and in parallel with the second relaxation oscillator capacitor 1442 to limit the voltage that will be seen by the second relaxation oscillator circuit 1322 if for some reason the second relaxation oscillator circuit attempted to go open circuit. As such, the second open circuit protection circuit 1470 similarly limits the maximum voltage across the second relaxation oscillator circuit 1322.

Again, the second relaxation oscillator circuit 1322 activates the second warning indicator circuit 1450. In some embodiments, the second warning indicator circuit 1450 includes a first pair of LED indicators 1451, 1452 coupled in series that are illuminated upon activation of the second switch circuit 1444. The LED indicators 1451, 1452 can generate an illumination that is different than those generated from the first warning indicator circuit 1420. For example, the first pair of LED indicators 1451, 1452 can generate a red illumination, and again, typically the illumination from the first pair of LED indicators 1451, 1452 is greater than the illumination generated from the first warning indicator circuit 1420.

In some embodiments, the failure protection circuitry can include a second failure protection circuitry within the second relaxation oscillator circuit 1322 and second warning indicator circuit 1450. The second failure protection circuit provides for an additional second switch 1446 within the second switch circuit 1444, where the second switch 1446 is coupled in parallel with the first switch 1445 providing an alternate path in an event of a failure of the first switch 1445 (or vise versa), with little or no effect on the capacitor system 1310. Further, the first protection circuit can extend to the second warning indicator circuit 1450 where the second warning indicator circuit can be configured in a series parallel configuration. In this configuration, the second warning indicator circuit 1450 includes the first pair of LED indicators 1451, 1452 (and/or other indicators) coupled in series, and a second pair of LED indicators 1453, 1454 coupled in series. Further, the first pair of LED indicators 1451, 1452 is coupled in parallel with the second pair of LED indicators 1453, 1454, while both the first and second pairs are further coupled in parallel with the second relaxation oscillator capacitor 1442. As such, protection for short circuit failure is provided in each pair through the series coupling of the LED indicators. Additionally, by coupling the first and second pairs of LED indicators in parallel protection for open circuit problems or failure is further provided.

Figure 15:
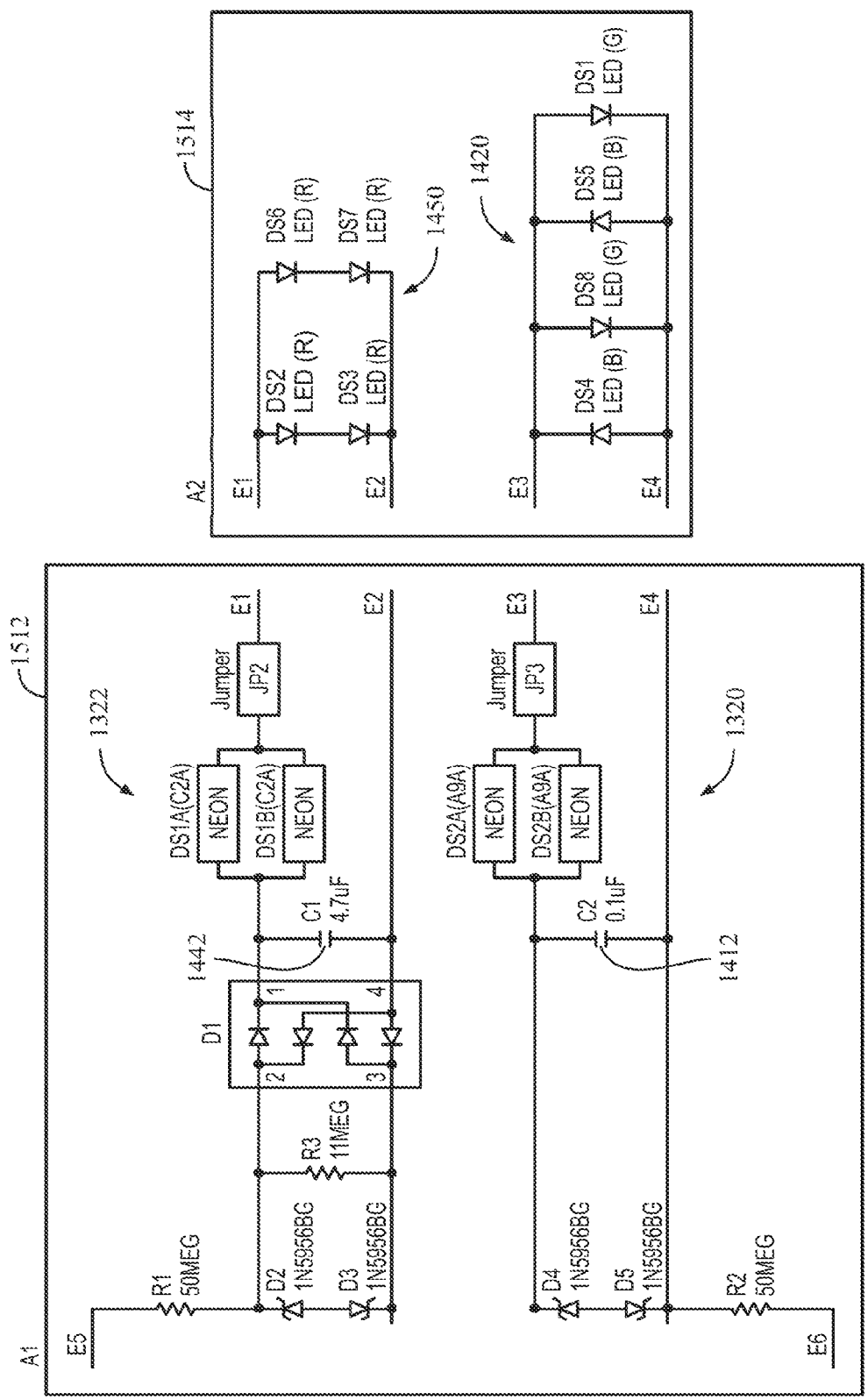
FIG. 15 depicts a simplified schematic representation of a relaxation oscillator circuit board, and an indicator circuit board that can be electrically coupled with the relaxation oscillator circuit board.

FIG. 15 depicts a simplified schematic representation of a relaxation oscillator circuit board 1512 and an indicator circuit board 1514 that can be electrically coupled with the relaxation oscillator circuit board 1512. In one embodiment, the relaxation oscillator circuit board 1512 includes the first and second relaxation oscillator circuits 1320, 1322, which in this example are equivalent to the first and second relaxation oscillator circuits 1320, 1322 of FIG. 14. The indicator circuit board 1514 includes the first and second warning indicator circuits 1420, 1450, which again in this example are equivalent to the first and second indicator circuits of 1420, 1450 of FIG. 14. The relaxation oscillator circuit board 1512 and the indicator circuit board 1514 can be positioned within the capacitor case 102 of the capacitor system 1310, and in some embodiments immersed within the dielectric fluid of the capacitor system 1310.

Referring next to FIGS. 16 and 17, where FIG. 16 shows an overhead view of a circuit board layout of the relaxation oscillator circuit board 1512, and FIG. 17 shows a side view of the relaxation oscillator circuit board 1512. The board layout identifies the high voltage resistors 107 and 108, the first relaxation oscillator circuit 1320 and the second relaxation oscillator circuit 1322. Further, the layout shows the positioning, in this embodiment, of the first relaxation oscillator capacitor 1412, the first and second switches 1415, 1416 of the first switch circuit 1414, the jumper 1434, the first open circuit protection circuitry 1430, the second relaxation oscillator capacitor 1442, the first and second switches 1445, 1446 of the second switch circuit 1444, the jumper 1480, the resistor 1476, the rectifier 1460 and the second open circuit protection circuitry 1470. Also shown in the circuit board layout are the lead connection points E5 and E6 that connect across the capacitor 101, as well as connector points E1, E2, E3 and E4 that correspond with connector points on the indicator circuit board 1514 to establish an electrical connection between the relaxation oscillator circuit board 1512 and the indicator circuit board 1514.

Figure 20:
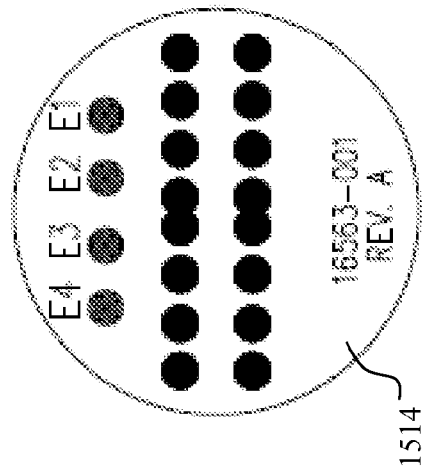
FIG. 20 shows a bottom view of the indicator circuit board of FIGS. 18-19.
Figure 19:
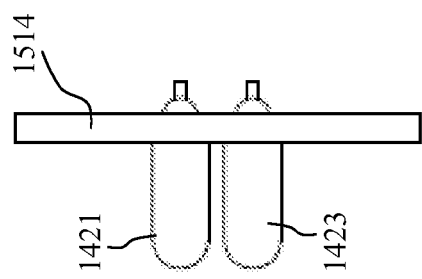
FIG. 19 shows a side view of an embodiment of an indicator circuit board.
Figure 18:
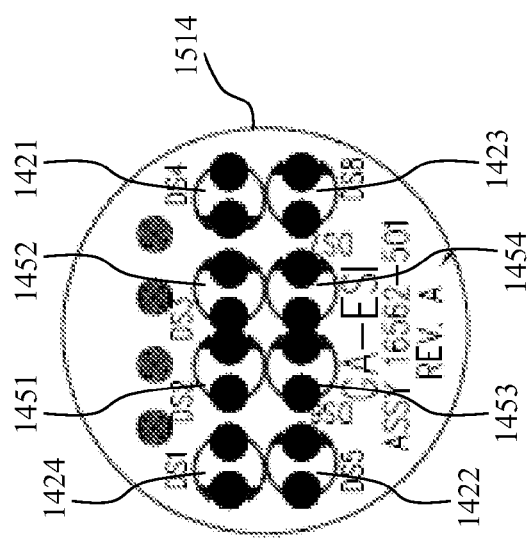
FIG. 18 shows an overhead view of an embodiment of a circuit board layout of an indicator circuit board.

Referring next to FIGS. 18-20, where FIG. 18 shows an overhead view of a circuit board layout of the indicator circuit board 1514, FIG. 19 shows a side view of the indicator circuit board 1514, and FIG. 20 shows a bottom view of the indicator circuit board 1514. In some embodiments, the indicator circuit board 1514 has a circular configuration that allows the indicator circuit board 1514 to be cooperated with a lens structure that is secured and sealed with the capacitor case 102 so that the indicators 1421-1424 and 1451-1454 can be seen from outside the capacitor case 102; however, it is noted that the indicator circuit board 1514 is not limited to the circular configuration. The board layout in FIG. 18 shows the positioning of the indicators 1421-1424 and 1451-1454. FIG. 19 shows indicators, such as LED indicators 1421, 1423, coupled with the indicator circuit board 1514. FIG. 20 shows the solder connections for the indicators as well as the corresponding connector points E1, E2, E3 and E4 that correspond with connector points on the relaxation oscillator circuit board 1512 to establish an electrical connection between the relaxation oscillator circuit board 1512 and the indicator circuit board 1514.

The example above shows two boards, the relaxation oscillator circuit board 1512 and the indicator circuit board 1514. It is noted, however, that the components can be combined onto a single board, or further separated into multiple additional boards for other configurations. Further, the relaxation oscillator circuit board 1512 and the indicator circuit board 1514 can be substantially any size depending on the size and number of components being incorporated onto the boards. In some embodiments, for example, the relaxation oscillator circuit board 1512 can have a length of about 5 inches and a width of about 1.85 inches, with a thickness of about 0.62 inches. Similarly, the indicator circuit board 1514, in some embodiments, can have a diameter that is less than 0.875 inches, such as a diameter of about 0.84 inches with a thickness of about 0.62 inches.

As described above, the indicator circuit board 1514, in some embodiments, is configured to cooperate with a lens structure that is sealed with the capacitor case 102 and retains the integrity of the capacitor system 1310, while allowing the indicator circuit board 1514, and thus the first and second warning indicator circuits 1420, 1450, to be retained within the capacitor case 102 yet still be visible from an exterior of the capacitor case.

Referring to FIGS. 21-23, FIG. 21 depicts a simplified cross-sectional view of a sight glass lens structure 2110*a* according to some embodiments, FIG. 22 depicts a simplified cross-sectional view of a sight glass lens structure 2110*b* according to some alternative embodiments, and FIG. 23 depicts a top view of the sight glass lens structure 2110*a*. The sight glass lens structure 2110*a* (and 2110*b*) includes a cylindrical housing 2112 with a central cavity 2114 extending along the housing 2112. A lens plate 2116 is secured with an interior surface 2120 of the housing proximate a front end 2122 of the housing, and seals the central cavity 2114. According to some embodiments, the sight glass lens structure is sealed with the capacitor case 102 and provides a barrier between the dielectric fluid and the air.

In some embodiments the sight glass lens structure 2110*a* is secured with the capacitor case 102 of the capacitor system 1310 through bonding, welding, threading, other such means or a combination of such means. Further, the sight glass lens structure can include a threading or other securing structure 2126 on an exterior of the housing 2112. This threading 2126 can allow an exterior lens or lens cover (see FIG. 25) to be cooperated with the sight glass lens structure, and/or allows the sight glass lens structure 2110*a* (or 2110*b*) to be cooperated with the capacitor case 102. In some embodiments, the sight glass lens structure 2110*a* includes a shoulder 2130 in the end of the housing 2112 opposite from the lens plate 2116. It is noted that the embodiments depicted in FIGS. 21-23 are cylindrical; however, other configurations can be used such as cubical, hexagonal, octagonal and other such configurations.

The size of the sight glass lens structure 2110*a* can be substantially any relevant size that can withstand the pressures within the capacitor case 102 of the capacitor system 1310. In some embodiments, the interior diameter of the central cavity 2114 has a dimension that is similar to that of the indicator circuit board 1514. In some exemplary embodiments, the sight glass lens structure 2110*a* can have an outer diameter of about 1.234 inches, an inner diameter of the central cavity 2114 of about 0.875 inches, and a height of about 0.675 inches.

Figure 24:
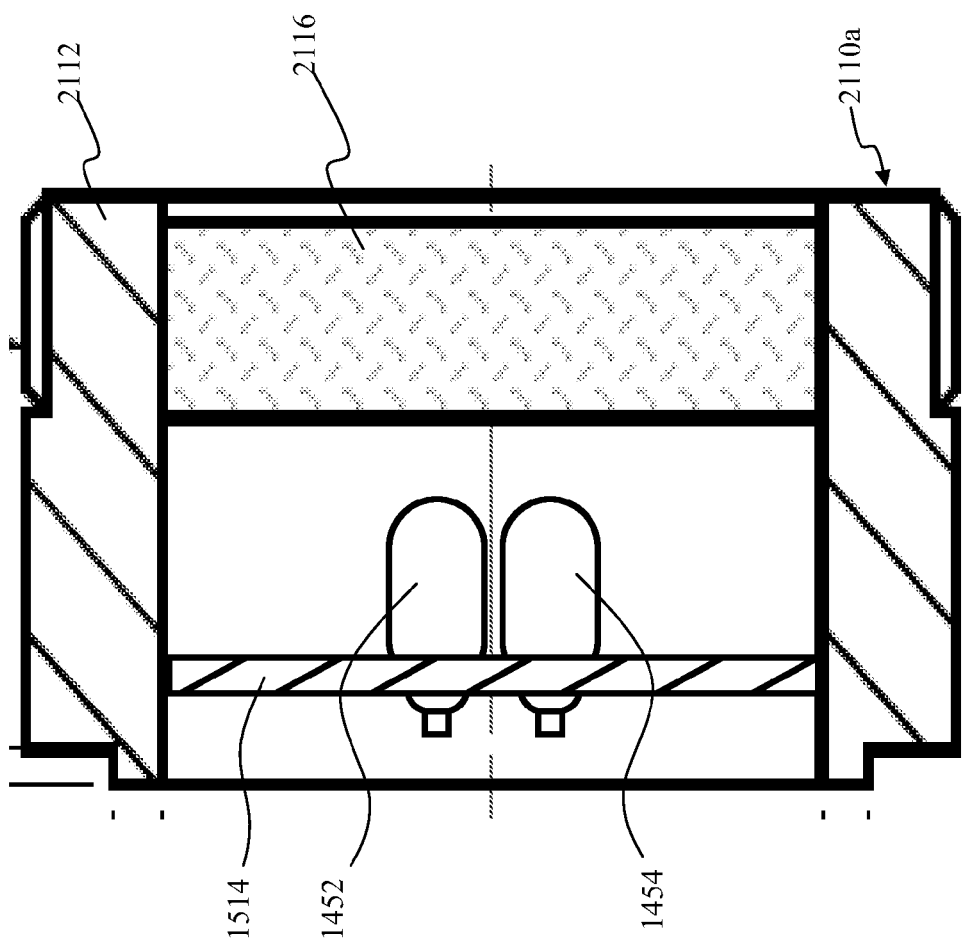
FIG. 24 depicts a simplified cross-sectional view of the sight glass lens structure of FIG. 21 with an indicator circuit board positioned within the sight glass lens structure.

FIG. 24 depicts a simplified cross-sectional view of the sight glass lens structure 2110*a* with an indicator circuit board 1514 that includes a plurality of LED indicators (for example, LED indicators 1452 and 1454) secured within the sight glass lens structure 2110*a*. The sight glass lens structure is sealed with the capacitor case 102 of the capacitor system 1310, in some embodiments, to retain the dielectric fluid within the capacitor case 102.

The lens plate 2116 can be substantially any relevant material capable of allowing the light of the LED indicators to be viewed, while still being able to be secured with the housing 2112 of the sight glass lens structure, seal the capacitor case 102 of the capacitor system 1310 (when needed), and maintain a pressure within the capacitor system 1310 (when needed). As examples, the lens plate 2116 can be constructed of glass, silicon, acrylic, polymers, rubies, or other such materials or combinations or compounds of such materials.

Figure 25:
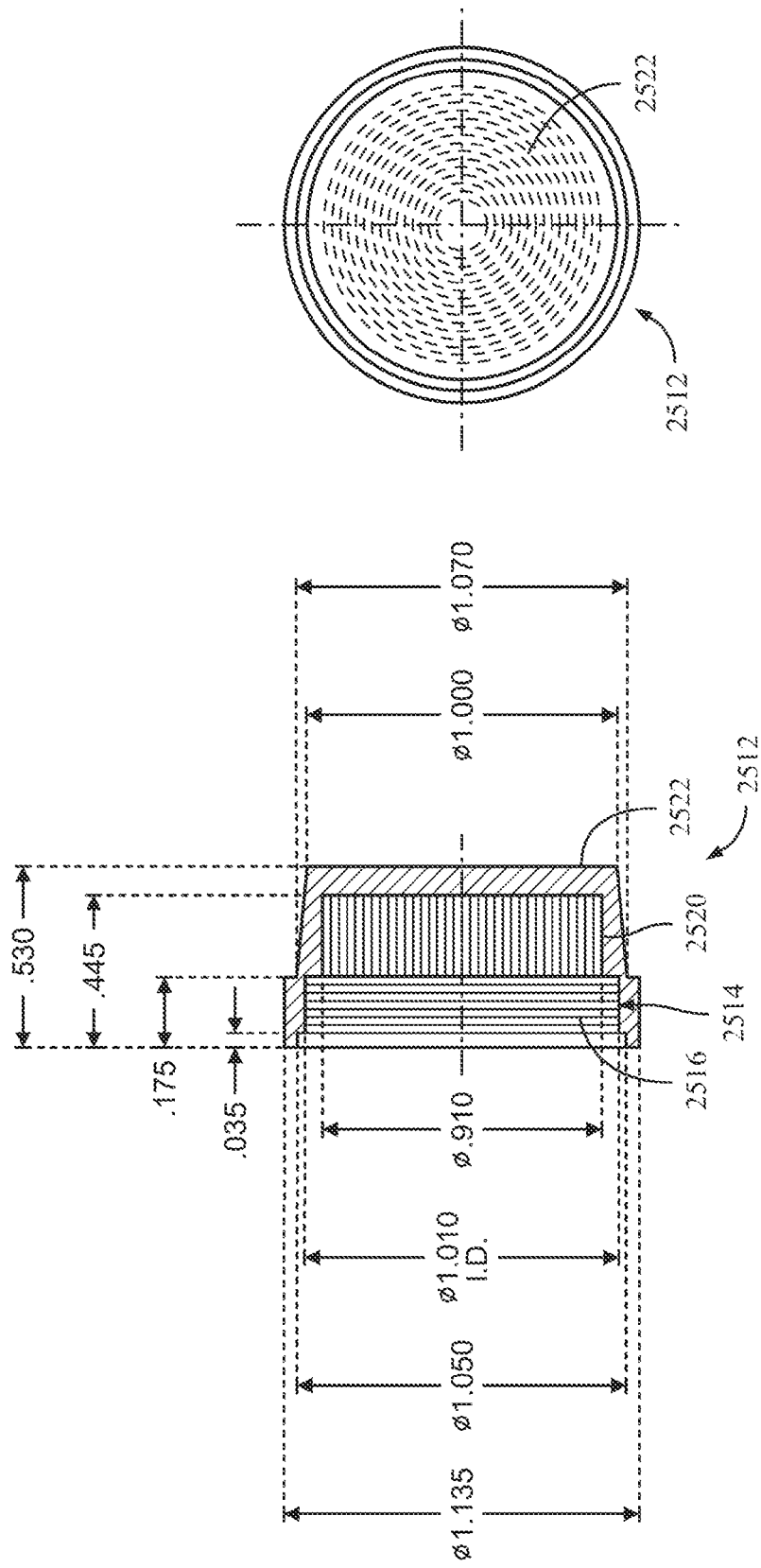
FIG. 25 is an illustration of one embodiment of a lens or lens cap, and a plane view of the lens cap looking into a cavity of the lens cap at a top or end plate.

Referring next to FIG. 25 shows a cross-sectional view of an example of a lens or lens cap 2512, and a plane view of the lens cap 2512 looking into a cavity of the lens cap at a top or end plate 2522. In some embodiments, the visibility of the illumination from the visual indicators, such as the LED indicators 1421-1424, 1451-1454, emitted through the sight glass lens structure 2110 may be limited and/or may have a narrow field of view, for example, due to the housing 2112 limiting the dispersion of the illumination. As such, some embodiments may employ a lens or lens cap 2512 that can aid in dispersing the illumination and allowing the illumination to be more readily visible from various angles. The lens cap 2512 can be substantially any shape (e.g., dome, bubble, pyramid, cylindrical, tapered, cone, multifaceted, rectangular, cubic, hemispherical, parabolic, concave and other such shapes or combinations of shapes) and/or size, but typically is configured to cooperate with the sight glass lens structure. In some embodiments, the lens cap 2512 can include threading to cooperate with the threading 2126 on the sight glass lens structure 2110*a*, when present.

In one example, the lens cap 2512 is generally bowl shaped having the threaded cylindrical portion 2514 with an interior threading 2516, a tapered wall 2520 extending from the threaded cylindrical portion 2514 to an end plate 2522. In some embodiments, the interior surface of the tapered wall 2520 and/or end plate 2522 may be faceted, grooved, etched or otherwise configured to disperse illumination. The exterior surface of the tapered wall and/or end plate may, in some embodiments, additionally or alternatively be faceted, grooved, etched or otherwise configured to disperse illumination. The lens cap 2512 can be constructed of substantially any relevant material such as plastic, glass, polycarbonate, or other such relevant material. Further, the lens cap 2512 may be colored or may include some tinting. For example, the lens cap can be red, yellow, blue, clear amber, clear blue, clear green, clear red, clear water, clear yellow or other such color or tinting.

In other embodiments, the lens cap 2512 is opaque and prevents light from being visible. This may be utilized to block the illumination from visible indicators (e.g., LED indicators 1421-1424 and 1451-1454), which may give an appearance that the warning indicator circuitry 1324 is disabled or shut off.

Figure 26:
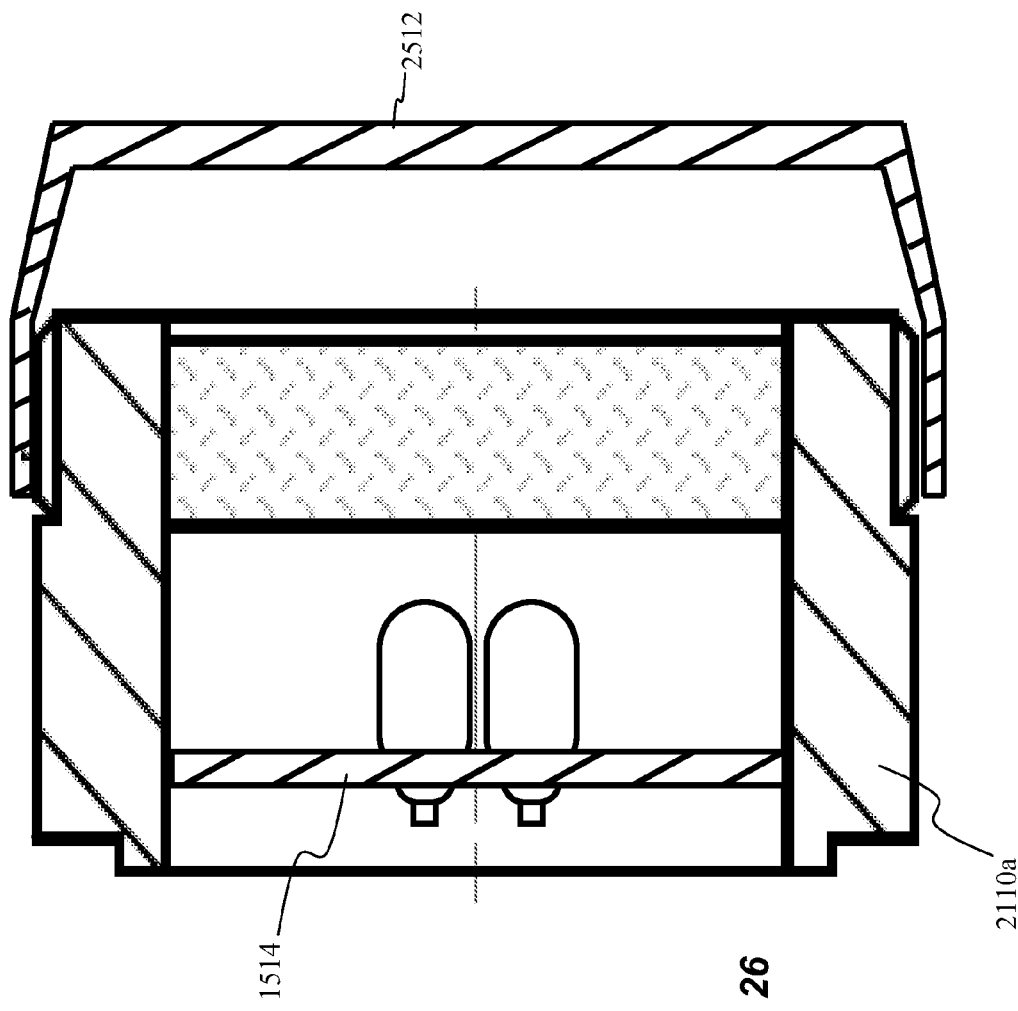
FIG. 26 shows a simplified cross-sectional view of the sight glass lens structure, with an incorporated indicator circuit board, of FIG. 24 cooperated with a lens cap.

FIG. 26 shows a simplified cross-sectional view of the sight glass lens structure 2110*a*, with an indicator circuit board 1514 cooperated within the sight glass lens structure. Further shown is a lens cap 2512 cooperated with the sight glass lens structure.

Figure 27:
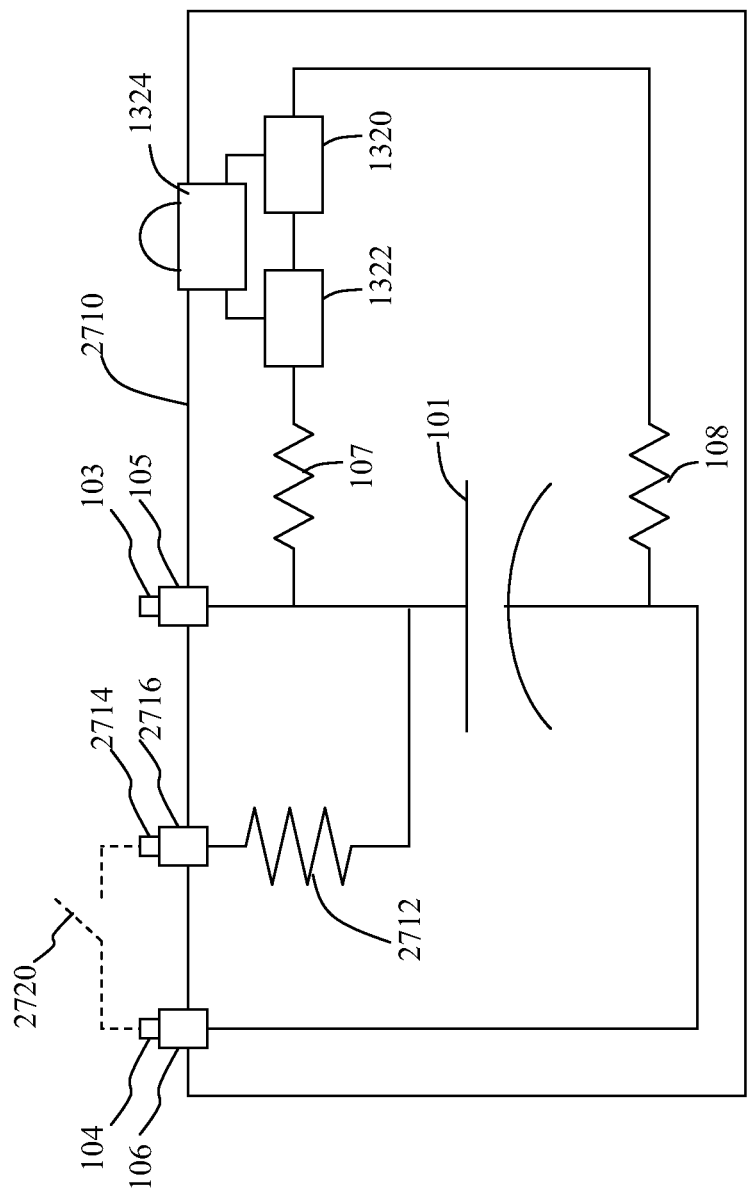
FIG. 27 is another embodiment of a capacitor system according to some embodiments.

FIG. 27 is another embodiment of a capacitor system 2710 according to some embodiments. The capacitor system 2710 is similar to the capacitor system 1310 of FIG. 13, including the capacitor 101 incased in a housing or case 102 with two terminals 103 and 104 fed through bushings 105 and 106, respectively, two high voltage resistors 107 and 108 coupled to either side of the capacitor 101, a first relaxation oscillator circuit 1320, a second relaxation oscillator circuit 1322 and warning indicator circuitry 1324. The capacitor system 2710 further includes a dump resistor or set of resistors 2712 coupled between the high current terminal 103 of the capacitor 101 and a third low current high voltage terminal 2714 fed through a third bushing 2716. The dump resistor 2712 allows the capacitor 101 to be rapidly discharged.

If the capacitor 101 is charged and the decision is made to dump the energy in the capacitor 101, the third terminal 2714 can be connected with the second terminal 104, for example through an external or internal dump or disarm switch 2720, to connect the dump resistor 2712 across the capacitor 101. The resistance of the dump resistor 2712 can be selected based on a desired RC time constant relative to the capacitance of the capacitor 101. In some embodiments, the resistance of the dump resistor 2712 is selected so that the voltage on the capacitor 101 can be dropped to a desired level (e.g., a non-lethal level) within about two seconds.

FIG. 28 depicts a simplified circuit diagram of a warning system 2810 according to some embodiments that couples with a high voltage high energy capacitor 101 (not shown) through the two high voltage resistors 107 and 108, where the high voltage high energy capacitor 101 can be similar to the high voltage high energy capacitors described above. The warning system 2810 includes two high voltage resistors 107 and 108 coupled to either side of the high voltage high energy capacitor 101, and a relaxation oscillator circuit 2812 that typically operates at a fraction of the voltage and/or energy level of the high voltage high energy capacitor 101, such as less than 10%, and typically less than 5%. The relaxation oscillator circuit 2812 includes one or more oscillator capacitors 2814 and a switching device 2816 coupled with a current limiting resistor 2820 that is further coupled with a warning indicator 2822. In this embodiment, the switching device 2816, the current limiting resistor 2820 and the warning indicator 2822 are coupled in parallel with the oscillator capacitor 2814. The switching device 2816 can be implemented through one or more devices, such as diode or trigger switch (e.g., DIAC (diode for alternating current), TRIAC, other such thyristors), neon lamp, or other such switching devices. FIG. 28 shows the switching device 2816 being implemented with a DIAC.

As the high voltage high energy capacitor 101 is charging an electrical charge accumulates on the oscillator capacitor 2814, and the voltage on the oscillator capacitor 2814 and the DIAC 2816 increases due to the relatively low current flowing into the warning system 2810 via the high voltage resistors 107 and 108. When the voltage across the DIAC reaches a threshold or breakdown voltage the DIAC is triggered and shorts or otherwise conducts current such that the oscillator capacitor 2814 discharges into and activates the warning indicator 2822. In some embodiments, the warning indicator can include one or more LEDs, buzzers or other visual and/or audio signal generators, and/or other such warning indicators. For example, the warning indicator 2822 can include an LED that flashes once in response to the DIAC conducting current.

The maximum current flowing through the warning circuit is limited by the impedance of the components including the current limiting resistor 2820 that limits the peak current associated with the discharge of the oscillator capacitor 2814. As the oscillator capacitor 2814 discharges, the capacitor voltage and voltage on the DIAC 2816 decrease and thus the current decreases. When the voltage and/or current on DIAC 2816 drops below a threshold level, the DIAC transitions back to a high impedance, non-conductive state. The oscillator capacitor 2814 will again begin to charge through the high voltage resistors 107 and 108 allowing the cycle to repeat. This will provide a repeating illumination or flashing of an LED of the warning indicator 2822.

The repetition rate of the circuit is affected by the RC time constant between the high voltage resistors 107, 108 and the oscillator capacitor 2814 as well as the voltage on the high voltage high energy capacitor 101. In some implementations, the repetition rate of the flashing of the warning indicator 2822 increases as the voltage on the high voltage high energy capacitor 101 increases to its fully charged state.

Typically, the DIAC 2816 has a breakover voltage or conducting voltage threshold that is less than a breakover voltage of neon lamps. For example, neon lamps often have a breakover voltage that is about 70 V or greater, while a breakover voltage for some DIACs can be as low as about 32 V. This lower breakover voltage allows the warning system 2810 to operate at a lower, and thus generally a safer, voltage. Additionally, DIACs typically have a more reliable, stable and consistent breakover voltage than neon lamps, while the breakover voltage of neon lamps often vary by relatively large amounts. Furthermore, DIACs are generally more durable than neon lamps while typically being much smaller and costing less, and still being a two terminal device that is readily incorporated into the warning system 2810.

An LED of the warning indicator 2822 can be substantially any relevant LED that generates a flash that can be visible to an observer and/or detected by a detector (e.g., light sensitive diode). Further, the current limiting resistor 2820 can be one of a wide range of resistances depending on many factors, including but not limited to, the expected voltage levels, the expected current, the breakover voltage, illumination intensity, number of warning indicators 2822 (e.g., number of LEDs) coupled with the current limiting resistor and/or other such factors. In some embodiments, for example, the current limiting resistor can have a resistance in the range of about 4.8K to 48K Ohms when operating with a DIAC having a breakover voltage of about 32 V. The current limiting resistor 2820 can further provide protection to the warning indicator 2822 in attempts to prevent a failure and/or burnout of the warning indicator, such as an LED.

Some embodiments further provide redundancy similar to some embodiments described above. For example, the warning system 2810 can include two or more DIACs 2816 coupled in parallel to provide redundancy and protection for the warning system. This can include protection against overheating of a DIAC which can result in an increase of voltage across the DIAC triggering the alternate DIAC to operate. Similarly, one or more warning indicators 2822 can be included and coupled in parallel and/or series. For example, two LEDs can be coupled in parallel; two sets of LEDs, which can include two or more LEDs coupled in series, can be coupled in parallel, which can provide redundancy for short and open failures; or other such redundant configurations.

Additionally, in some embodiments the warning system 2810 can be configured with two or more relaxation oscillator circuits 2812 for redundancy and/or two or more relaxation oscillator circuits 2812 can be utilized with each having a different threshold or breakdown voltage such that multiple different indicators can be provided to indicate different voltage levels across the high voltage high energy capacitor 101. For example, two relaxation oscillator circuits 2812 can be implemented to some or all of the warning system of FIG. 14. In other embodiments, one or more of the switches 1415, 1415, 1445, 1446 of the warning system of FIG. 14 can be implemented with a DIAC, such as the DIAC 2816.

FIG. 29 depicts a simplified circuit diagram of a warning system 2910 according to some embodiments. Similar to the warning system 2810 of FIG. 28, the warning system 2910 includes two high voltage resistors 107 and 108 coupled to either side of a high voltage high energy capacitor 101 (not shown), and a relaxation oscillator circuit 2912. The relaxation oscillator circuit 2912 includes one or more oscillator capacitors 2914 and a switching device 2916, which in this embodiment is implemented through a DIAC or other such device, that is further coupled with a current limiting resistor 2920 that is coupled with a warning trigger system 2922. The warning trigger system 2922 includes a trigger capacitor 2924, a trigger resistor 2926 and a warning indicator 2930, such as one or more LEDs, buzzers and/or other such warning indicators.

The oscillator capacitor 2914 is coupled in parallel with the DIAC 2916, the current limiting resistor 2920 and the warning trigger system 2922. As with the warning system 2810, an electrical charge accumulates on the oscillator capacitor 2914 as the high voltage high energy capacitor 101 is charging, and the voltage on the oscillator capacitor 2914 and the DIAC 2916 increases. When the voltage across the DIAC 2916 reaches a threshold or breakdown voltage the DIAC is triggered and conducts current around the warning circuit 2910 as oscillator capacitor 2914 discharges activating the warning trigger system 2922. As current is passed through the DIAC 2916 the trigger capacitor 2924 is charged and subsequently discharges to drive the warning indicator 2930.

The trigger capacitor 2924 is coupled in parallel with the trigger resistor 2926 and warning indicator 2930. Further, the trigger capacitor 2924 and the trigger resistor 2926 are selected to achieve a desired RC time constant to achieve a desired indication or flash duration as the trigger capacitor discharges to drive the indicator. As such, the warning trigger system 2922 can be employed to achieve a desired flash duration of the warning indicator 2930. For example, the trigger capacitor 2924 and trigger resistor 2926 can be selected to achieve a flash duration in the millisecond range, such as in the 5 to 100 millisecond range. It is noted, however, that the trigger capacitor 2624 and trigger resistor 2926 can be selected to achieve substantially any relevant RC time constant to achieve a flash of the warning indicator 2930 for a desired flash duration to be visible to an observer and/or detected by detector (e.g., photodiode).

Again, in some embodiments the warning system 2910 can be configured with two or more relaxation oscillator circuits 2912 for redundancy and/or having different thresholds or breakdown voltages. Similarly, the relaxation oscillator circuits described above, for example in FIGS. 1, 9, 10 14 and 15, can be replaced with a relaxation oscillator circuit similar to the relaxation oscillator circuit 2812 or 2912 of FIG. 28 or 29, respectively.

Figure 30:
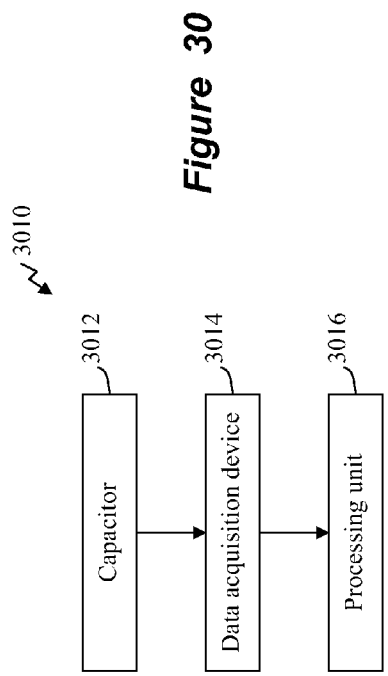
FIG. 30 depicts a simplified block diagram of a monitoring system according to some embodiments.

FIG. 30 depicts a simplified block diagram of a monitoring system 3010 according to some embodiments. The monitoring system 3010 is cooperated with a capacitor or capacitor system 3012, such as the capacitor systems and warning systems described above (e.g., capacitor systems and/or warning systems described above with reference to FIGS. 1-11, 13, 14-15 and 27-29). Further, the monitoring system 3010 includes one or more data acquisition devices 3014 that are wired or wirelessly coupled with a processing unit 3016, for example, over a communication link or cable. The monitoring system 3010 allows for the tracking or monitoring of parameters associated with the capacitor system 3012, high voltage high energy capacitor 101 and/or warning system.

In some embodiments, the one or more data acquisition devices 3014 comprise one or more detectors, monitors or the like. For example the data acquisition device 3014 can include a photo-sensitive detector positioned to detect illumination emitted from the one or more neon lamps and/or LEDs of a warning indicator of the capacitor system 3012 (e.g., neon lamp 1002 or LEDs 1421-1424, 1451-1454, 2822, 2930). The data acquisition device 3014 can be positioned relative to a lens 111 of the capacitor system 3012 to detect flashes emitted by one or more LEDs of a warning system of the capacitor system 3012. In operation, the detector detects the flashing from a lamp or LED and communicates the detection to the processing unit 3016. The processing unit 3016 can be implemented through a computer, one or more processors and/or a microprocessor. The processing unit 3016 is configured to and/or programmed to determine relevant parameters from the information provided by the data acquisition device 3014.

Figure 31:
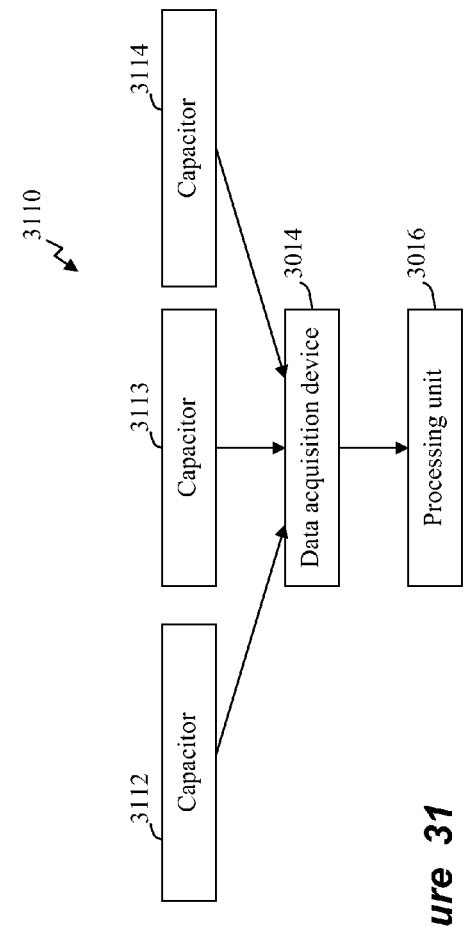
FIG. 31 depicts a simplified block diagram of a monitoring system according to some embodiments where more than one or a bank of capacitors or capacitor systems are being monitored.

FIG. 31 depicts a simplified block diagram of a monitoring system 3110 according to some embodiments where more than one or a bank of capacitors or capacitor systems 3112-3114 are being monitored. For example, the capacitors 3112-3114 can be part of a single capacitor system, or can be separate systems. One or more data acquisition devices 3104 are positioned to detect parameters, such as flashes from one or more neon lamps or LEDs of the capacitor systems. The measured or detected results are forwarded to a processing unit 3016 that determines parameters relative to the capacitor systems 3112-3114, such as the voltage level across the capacitor(s) of each capacitor system based on the flash rate detected at each capacitor system (or at each capacitor or bank of capacitors).

Referring to FIGS. 30 and 31, the processing unit 3016 determines relevant parameters from the information provided by the one or more data acquisition devices 3014. For example, the processing unit 3016 receives signals indicating detected flashes and in turn determines a flash rate. As described above, the voltage level on the charged high voltage high energy capacitor 101 being monitored causes, at least in some embodiments, the warning circuit to flash at a rate that is proportional to the voltage level. With knowledge of the component values of the warning system and/or relaxation oscillator circuit, and by measuring the frequency of the flash rate, the processing unit 3016 can calculate the voltage level of the high voltage high energy capacitor 101 being monitored.

For example, the voltage can be monitored based on a limited or specified window of time (e.g., of length dt). The data acquisition device 3014 provides a signal for each detected flash or a count of flashes within the window of time designating a count of flashes or pulses detected during the window of time. The flash rate, which in some implementations is proportional to the voltage across the high voltage high energy capacitor, and is further generally governed by the component values of the capacitor of the warning circuit (e.g., oscillator capacitor 2814, 2914) and the resistance of the warning circuit (e.g., current limiting resistor 2820; or current limiting resistor 2920 and trigger resistor 2926). With knowledge of these values the number of flashes detected within the specified amount of time can be related to an accurate estimation of voltage that is on the terminals of the warning or safety circuit (e.g., warning system 2810 or 2910), and thus the voltage on the high voltage high energy capacitor 101.

Some embodiments are further capable of monitoring the capacitance of the high voltage high energy capacitor 101 being monitored. Again, the processing unit 3016, with knowledge of the component values in the warning and/or relaxation oscillator circuit, and by determining the flash rate, can calculate a current drawn into the warning circuit bases on the determined voltage across the terminals of the warning circuit and with knowledge of high voltage resistors 107 and 108. Additionally, by monitoring the flash rate over time, the processing unit 3016 can calculate a change in voltage with respect to time (dV/dt). For example, the number of pulses or flashes detected can be counted for two windows of time (V(t) and V(t+1)), typically sequential period of time. Using the method described above, the voltage for each window in time can be calculated. The change in voltage can then be calculated ((V(t+1)−V(t))/dt). The change in current can be calculated in a similar manner.

A change in charge with respect to time (dQ/dt) can also be calculated. The voltage at a point in time is obtained by monitoring the flash frequency with time. By knowing the values of the two high voltage resistors 107, 108, the current can be calculated. The processing unit 3016 monitors these two values over time using the above methods and calculates the change in charge the capacitor draws with time by using the relationship of current to charge over time (I=dQ/dt). The change in voltage with time, dV/dt, is monitored using the methods above. The dynamic capacitance of the high voltage high energy capacitor 101 at a particular voltage can then be calculated by dividing the change in voltage with respect to time by the change in charge with respect to time (C(V)=(dV/dt)/(dQ/dt)).

Some embodiments additionally or alternatively identify other operating parameters of the capacitor system. For example, a temperature of the high voltage high energy capacitor 101 and/or the capacitor system can similarly be determined based on flash detection. Some embodiments incorporate a thermocouple into the capacitor system that can affect a flash rate of an LED or other indicator. In some implementations, a thermocouple is coupled in parallel with a warning circuit, such as the warning system 2810 and/or 2910 of FIGS. 28-29, or with a separate warning circuit used to measure temperature. The resulting flash rate of the LED of the warning circuit will vary with a change in temperature, which in some implementations manifests itself as a change in resistance of the thermocouple. Again, the data acquisition device 3014 detects the flash and notifies the processing unit 3016 allowing the processing unit 3016 to monitor the flash rate. With knowledge of the values of the components in the corresponding warning circuit, a temperature associated with the capacitor being monitored and/or within the capacitor case 102 can be monitored. Further embodiments can determine pressure within the capacitor case 102 and/or other parameters.

It is further noted that the monitoring can be used to monitor a single capacitor, a bank of capacitors or a subset of a bank of capacitors. Parameters of interest to operators of pulse forming networks include, among other things, the voltage on one or more or each capacitor, the capacitance of one or more or each capacitor, and the temperature of one or more or each capacitor. Monitoring of these parameters can improve the functioning and overall health of a capacitor, bank of capacitors and a capacitor system, such as those described above. A method of monitoring a capacitor bank is achieved by cooperating a plurality of capacitors monitored by the warning circuit to a data acquisition device, such as a photo-sensitive device, that is connected to the processing unit 3016. The processing unit 3016, in some embodiments, implements computer readable code, executables and/or software, that allows the processing unit to monitor these parameters and displays them to the operator.

The processing unit 3016 can be implemented through substantially any processing device capable of receiving the input from the one or more data acquisition devices 3014 and implementing the computer readable code to monitor relevant parameters. In some embodiments the processing unit 3016 is implemented through a computer, one or more processors or one or more microprocessors. In other embodiments, the processing unit 3016 is specifically configured to perform the monitoring. In still further embodiments, the processing unit 3016 may mount or attach directly to the capacitor case 102. For example, the one or more detectors can be positioned within a monitoring device casing that is mounted, positioned or secured with the capacitor case relative to, and in some instances over, one or more lenses 111 and/or lens cap 2512.

The processing unit 3016 typically further includes one or more displays, monitors, touch screens, gauges, other read outs or combinations thereof. Upon determining one or more of the monitored parameters, the processing unit 3016 can display or otherwise report the levels of the determined parameters. Additionally or alternatively, the processing unit 3016 can include a port to couple with the one or more data acquisition devices 3014, and can additionally or alternatively include one or more communication ports to communicate the parameters, for example to a remote device via wired or wireless communication, and/or to receive communications, commands, instructions, code, updates, software, parameters, conditions and/or the like.

Typically, the processing unit 3016 is maintained outside of the capacitor case 102 and generally isolated from the high voltage circuit. In other embodiments, however, the monitoring system 3010 may be incorporated into the capacitor system and within the capacitor case 102 with the monitoring system maintained substantially isolated from the high voltage circuit, and with the display being incorporated with the capacitor case 102 to be visible from an exterior of the capacitor case.

As introduced above, the one or more data acquisition devices 3014 typically are optical or light detectors that detect visible or non-visible emissions, such as photodiodes. Further, a data acquisition device can be selected and/or tuned to be sensitive to a limited frequency or wavelength range, such as a color or range of ultraviolet light. For example, a photodiode can be utilized that is tuned to red light allowing the photodiode to detect flashing of a red LED so that flashes of other colored LEDs are not detected by the red tuned photodiode. Again, multiple photodiodes can be utilized to forward indications and/or counts of corresponding detected flashes to the processing unit 3016. Additionally, some embodiments include a mounting that allows the one or more data acquisition devices 3014 to be mounted with the capacitor case 102 and positioned to detect flashes from one or more indicators.

While the invention herein disclosed has been described by means of specific embodiments and applications thereof, numerous modifications and variations could be made thereto by those skilled in the art without departing from the scope of the invention set forth in the claims.

What is claimed is:

1. A capacitor warning circuit comprising:
   a case;
   a high voltage high energy capacitor positioned and sealed within the case, wherein the capacitor is configured to be charged to at least a first charged state; and
   a warning circuit coupled to the capacitor, wherein the warning circuit is contained and sealed within the case and is adapted to provide an indication that the capacitor is in the first charged state and an indication of polarity with which a charging source is coupled across the capacitor in charging the capacitor, wherein the warning circuit is powered by energy accumulated in the capacitor when the capacitor is charged to the first charged state.

2. The circuit of claim 1 wherein the first charged state represents a stored energy level in which the capacitor is harmful to a human operator through inadvertent contact with terminals of the capacitor.

3. A capacitor warning circuit comprising:
   a case;
   a high voltage high energy capacitor positioned and sealed within the case, wherein the capacitor is configured to be charged to at least a first charged state; and
   a warning circuit coupled to the capacitor, wherein the warning circuit is adapted to provide an indication that the capacitor is in the first charged state, wherein the warning circuit is powered by energy accumulated in the capacitor when the capacitor is charged to the first charged state;
   wherein the first charged state represents a stored energy level harmful to a human operator through inadvertent contact with terminals of the capacitor;
   wherein the capacitor is further configured to be charged to at least a second charged state, wherein the second charged state is higher than the first charged state; and
   wherein the warning circuit coupled to the capacitor is further adapted to provide an indication that the capacitor is in the second charged state, wherein the warning circuit is powered by the energy accumulated in the capacitor when the capacitor is charged to the second charged state, and the second charged state represents a stored energy level in which the capacitor is lethal to the human operator through contact with the terminals of the capacitor.

4. The circuit of claim 3 wherein the warning circuit comprises a polarity circuit adapted to indicate a polarity with which a charging source is coupled across the capacitor in charging the capacitor.

5. The circuit of claim 4 wherein the polarity circuit comprises:
   a first indicator adapted to indicate a first polarity; and
   a second indicator adapted to indicate a second polarity.

6. The circuit of claim 5 wherein the first indicator comprises a first light emitting diode coupled in a first orientation across terminals of the capacitor, and the second indicator comprises a second light emitting diode coupled in a second orientation across the terminals of the capacitor.

7. The circuit of claim 6 wherein the warning circuit comprises a failure protection circuitry adapted to protect against a failure of one of the first indicator and the second indicator, wherein the failure protection circuitry comprises:
   a third indicator adapted to indicate the first polarity, wherein the third indicator comprises a third light emitting diode coupled in the first orientation across the terminals of the capacitor; and
   a fourth indicator adapted to indicate the second polarity, wherein the fourth indicator comprises a fourth light emitting diode coupled in a second orientation across the terminals of the capacitor;
   wherein the first light emitting diode, the second light emitting diode, the third light emitting diode, the fourth light emitting diode are coupled in parallel.

8. The circuit of claim 7 wherein the warning circuit further comprises a first switch coupled with the first indicator, the second indicator, the third indicator and the fourth indicator, wherein the first switch is adapted to periodically and repetitively activate two of the first indicator, the second indicator, the third indicator and the fourth indicator; and
   the failure protection circuitry comprises a second switch coupled with the first indicator, the second indicator, the third indicator and the fourth indicator, and further coupled in parallel with the first switch.

9. The circuit of claim 8 wherein the warning circuit is contained and sealed within the case.

10. The circuit of claim 3 wherein the warning circuit is contained and sealed within the case.

11. A capacitor warning circuit comprising:
    a case;
    a high voltage high energy capacitor positioned and sealed within the case, wherein the capacitor is configured to be charged to at least a first charged state; and
    a warning circuit coupled to the capacitor, wherein the warning circuit is adapted to provide an indication that the capacitor is in the first charged state, wherein the warning circuit is powered by energy accumulated in the capacitor when the capacitor is charged to the first charged state;
    wherein the warning circuit comprises a first circuit board and a second circuit board positioned within the case;
    wherein the first circuit board comprises a first relaxation oscillator circuit and a second relaxation oscillator circuit;

wherein the second circuit board comprises a first indicator circuit coupled with and activated by the first relaxation oscillator circuit, and a second indicator circuit coupled with and activated by the second relaxation oscillator circuit.

12. A capacitor warning circuit comprising:
a case;
a high voltage high energy capacitor positioned and sealed within the case, wherein the capacitor is configured to be charged to at least a first charged state; and
a warning circuit coupled to the capacitor, wherein the warning circuit is adapted to provide an indication that the capacitor is in the first charged state, wherein the warning circuit is powered by energy accumulated in the capacitor when the capacitor is charged to the first charged state;
wherein the warning circuit comprises a first relaxation oscillator circuit and a second relaxation oscillator circuit;
wherein the first relaxation oscillator circuit is adapted to provide the indication that the capacitor is in the first charged state; and
wherein the second relaxation oscillator circuit is adapted to provide an indication that the capacitor is in a second charged state,
wherein the warning circuit is powered by the energy accumulated in the capacitor and the second charged state is at a higher voltage than the first charged state.

13. The circuit of claim 12, wherein the first relaxation oscillator circuit comprises:
a first relaxation oscillator capacitor;
a first indicator; and
a first switch circuitry;
wherein the first switch circuitry is coupled in series with the first indicator, and the first relaxation oscillator capacitor is coupled in parallel with the first switch circuitry and the first indicator.

14. The circuit of claim 13, wherein the second relaxation oscillator circuit comprises:
a second relaxation oscillator capacitor;
a rectifier in parallel with the second relaxation oscillator capacitor;
a second indicator; and
a second switch circuitry;
wherein the second switch circuitry is coupled in series with the second indicator, and the second relaxation oscillator capacitor is coupled in parallel with the second switch circuitry and the second indicator.

15. The circuit of claim 12 wherein the warning circuit comprises an open circuit protection circuitry adapted to protect the warning circuit in an event of an occurrence of an open circuit relative to the warning circuit, wherein the open circuit protection circuitry comprises a first open circuit protection circuitry adapted to protect the first relaxation oscillator circuit, and a second open circuit protection circuitry adapted to protect the second relaxation oscillator circuit.

16. A capacitor warning circuit comprising:
a case;
a high voltage high energy capacitor positioned and sealed within the case, wherein the capacitor is configured to be charged to at least a first charged state; and
a warning circuit coupled to the capacitor, wherein the warning circuit is adapted to provide an indication that the capacitor is in the first charged state, wherein the warning circuit is powered by energy accumulated in the capacitor when the capacitor is charged to the first charged state;
wherein the warning circuit comprises:
a relaxation oscillator capacitor coupled in parallel with the high voltage high energy capacitor;
a switch comprising a DIAC; and
an indicator coupled in series with the switch such that the switch and the indicator are coupled in parallel with the relaxation oscillator capacitor.

17. The circuit of claim 16, wherein the warning circuit further comprises:
a trigger capacitor coupled in parallel with the indicator such that the trigger capacitor discharges to extend an activation of the indicator and extend an indication duration.

18. The circuit of claim 3 wherein the capacitor comprises at least a 50 VDC capacitor configured to store at least 5 Joules of energy.

19. The circuit of claim 3 wherein the capacitor comprises at least a 10,000 VDC capacitor configured to store at least 10,000 Joules of energy.

20. The circuit of claim 3 wherein the warning circuit comprises one or more high voltage resistors coupled to at least one side of the capacitor such that the warning circuit operates at low current and is not harmful to a human operator through contact with the warning circuit.

21. The circuit of claim 3 wherein the warning circuit comprises multiple warning indicators that work together to indicate when the capacitor is nearing a fully charged state and when the capacitor is nearing a boundary of the first charged state.

22. The circuit of claim 3 further comprising a disarm switch coupled to the warning circuit and adapted to allow the human operator to selectively disarm the warning circuit.

23. The circuit of claim 3 wherein the warning circuit comprises a second capacitor that charges as current flows from the capacitor to the second capacitor, wherein the second capacitor discharges when the voltage of the second capacitor reaches a level that a warning indicator conducts.

24. The circuit of claim 23 wherein the second capacitor repetitively charges and discharges provide a repetitive indication that the capacitor is in the first charged state.

25. A method of providing a warning for a capacitor comprising:
charging a voltage of a capacitor to at least a first charged state; and
powering a warning circuit coupled to the capacitor with energy accumulated in the capacitor when the capacitor is in a charged state;
providing, by the warning circuit, an indication when the capacitor voltage has reached the first charged state;
charging the capacitor to at least a second charged state, wherein the second charged state is higher than the first charged state; and
providing, by the warning circuit, an indication that the capacitor is charged to at least the second charged state, wherein the second charged state represents a stored energy level in which the capacitor is lethal to a human.

* * * * *